(12) United States Patent
Mozak et al.

(10) Patent No.: US 9,009,531 B2
(45) Date of Patent: Apr. 14, 2015

(54) MEMORY SUBSYSTEM DATA BUS STRESS TESTING

(71) Applicant: Intel Corporation, Santa Clara, CA (US)

(72) Inventors: Christopher P. Mozak, Beaverton, OR (US); Theodore Z. Schoenborn, Portland, OR (US); James M. Shehadi, Portland, OR (US); David G. Ellis, Tualatin, OR (US)

(73) Assignee: Intel Corporation, Santa Clara, CA (US)

( * ) Notice: Subject to any disclaimer, the term of this patent is extended or adjusted under 35 U.S.C. 154(b) by 116 days.

(21) Appl. No.: 13/706,177

(22) Filed: Dec. 5, 2012

(65) Prior Publication Data

US 2014/0157053 A1 Jun. 5, 2014

(51) Int. Cl.
| | |
|---|---|
| *G06F 11/00* | (2006.01) |
| *G11C 29/02* | (2006.01) |
| *G11C 29/06* | (2006.01) |
| *G11C 29/36* | (2006.01) |
| *G11C 29/50* | (2006.01) |
| *G11C 29/52* | (2006.01) |

(52) U.S. Cl.
CPC .............. *G11C 29/02* (2013.01); *G11C 29/022* (2013.01); *G11C 29/06* (2013.01); *G11C 29/36* (2013.01); *G11C 29/50012* (2013.01); *G11C 29/52* (2013.01)

(58) Field of Classification Search
CPC ....................................................... G11C 29/10
USPC ................................ 714/32, 42, 54, 718, 733
See application file for complete search history.

(56) References Cited

U.S. PATENT DOCUMENTS

| | | |
|---|---|---|
| 5,271,020 A | 12/1993 | Marisetty et al. |
| 5,282,272 A | 1/1994 | Guy et al. |
| 5,373,535 A | 12/1994 | Ellis et al. |
| 5,394,557 A | 2/1995 | Ellis |
| 5,410,664 A | 4/1995 | Brooks et al. |
| 5,416,807 A | 5/1995 | Brady et al. |
| 5,436,927 A | 7/1995 | Brady et al. |
| 5,696,940 A | 12/1997 | Liu et al. |
| 5,809,038 A | 9/1998 | Martin |
| 6,191,713 B1 | 2/2001 | Ellis et al. |
| 6,307,806 B1 | 10/2001 | Tomita et al. |

(Continued)

FOREIGN PATENT DOCUMENTS

WO WO 2013/002789 A1 1/2013

*Primary Examiner* — Dieu-Minh Le
(74) *Attorney, Agent, or Firm* — Blakely, Sokoloff, Taylor & Zafman LLP

(57) ABSTRACT

A memory subsystem includes a test signal generator of a memory controller that generates a test data signal in response to the memory controller receiving a test transaction. The test transaction indicates one or more I/O operations to perform on an associated memory device. The test signal generator can generate data signals from various different pattern generators. The memory controller scheduler schedules the test data signal pattern, and sends it to the memory device. The memory device can then execute I/O operation(s) to implement the test transaction. The memory controller can read back data written to a specific address of the memory device and compare the read back data with expected data. When the read back data and the expected data do not match, the memory controller can record an error. The error can include the specific address of the error, the specific data, and/or encoded data.

27 Claims, 13 Drawing Sheets

(56) References Cited

U.S. PATENT DOCUMENTS

| | | | |
|---|---|---|---|
| 6,553,525 B1 | 4/2003 | Shephard, III et al. |
| 6,747,471 B1 | 6/2004 | Chen et al. |
| 6,826,100 B2 | 11/2004 | Ellis et al. |
| 6,839,288 B1 | 1/2005 | Kim et al. |
| 6,944,806 B2 | 9/2005 | Flynn et al. |
| 7,117,416 B1 | 10/2006 | Fox |
| 7,139,957 B2 | 11/2006 | Querbach et al. |
| 7,178,076 B1 | 2/2007 | Zarrineh et al. |
| 7,203,872 B2 | 4/2007 | Frodsham et al. |
| 7,260,759 B1 | 8/2007 | Zarrineh et al. |
| 7,313,712 B2 | 12/2007 | Cherukuri et al. |
| 7,366,964 B2 | 4/2008 | Frodsham et al. |
| 7,415,032 B2 | 8/2008 | Drottar et al. |
| 7,464,307 B2 | 12/2008 | Nejedlo et al. |
| 7,681,093 B2 | 3/2010 | Frodsham et al. |
| 7,711,878 B2 | 5/2010 | Cherukuri et al. |
| 7,743,176 B1 | 6/2010 | Turney et al. |
| 7,746,795 B2 | 6/2010 | Frodsham et al. |
| 7,886,174 B2 | 2/2011 | Spry et al. |
| 7,957,428 B2 | 6/2011 | Steinman et al. |
| 8,195,996 B2 | 6/2012 | Frodsham et al. |
| 8,225,151 B2 | 7/2012 | Rajeev et al. |
| 8,250,416 B2 | 8/2012 | Frodsham et al. |
| 8,331,176 B2 | 12/2012 | Mozak et al. |
| 8,819,474 B2 | 8/2014 | Schoenborn et al. |
| 2002/0003049 A1 | 1/2002 | Dabral et al. |
| 2004/0117708 A1 | 6/2004 | Ellis et al. |
| 2004/0153850 A1 | 8/2004 | Schoenborn et al. |
| 2004/0218440 A1* | 11/2004 | Kumar et al. ............... 365/202 |
| 2005/0262184 A1 | 11/2005 | Cherukuri et al. |
| 2007/0220378 A1* | 9/2007 | Mamileti et al. ............ 714/718 |
| 2011/0161752 A1 | 6/2011 | Spry et al. |
| 2013/0031281 A1* | 1/2013 | Feehrer et al. ............... 710/23 |
| 2014/0026005 A1* | 1/2014 | Roohparvar et al. ....... 714/718 |
| 2014/0032826 A1* | 1/2014 | Lee et al. .................... 711/104 |

* cited by examiner

MEMORY SUBSYSTEM DATA BUS STRESS TESTING

FIELD

Embodiments of the invention are generally related to memory subsystems, and more particularly to providing deterministic memory testing.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2012, Intel Corporation, All Rights Reserved.

BACKGROUND

Memory devices find ubiquitous use in electronic devices, such as in consumer electronics. Memory devices are typically used to store executable code and data for the runtime operation of the electronic device. Many electronic devices stay operating almost continuously for long periods of time, potentially transferring large amounts of data in and out of the memory devices. Thus, it is important that the memory devices perform according to design expectations. However, memory devices are subject to failure from design issues or manufacturing inconsistencies. The failures can show up right after manufacturing as well as in operation of the devices.

Memory testing is used to detect abnormalities or other unexpected behavior in the memory devices. Some errors relate to the operation of the memory subsystem with respect to storing and transferring data. Other errors relate to the operation of the memory subsystem with respect to commands. Traditional testing has been performed through software systems, which have required a constant starting and stopping of the testing to generate the desired high-stress traffic, or through hardware that has very limited data patterns that can be used. Thus, no traditional memory testing has been able to produce high-traffic I/O stress in a way that tests different types of traffic patterns.

Additionally, prior testing systems provide very limited logging or recording of errors, making it difficult to determine what errors were produced. Hardware systems have traditionally been very limited and not logged sufficient data to determine what command/data combination produced an error. Software systems have also not necessarily logged sufficient data to determine what command/data combination produced an error. Even assuming such information could be gathered, software test systems produce traffic that can be reordered prior to execution, which produces uncertainty in what test command/data combination produced a failure.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
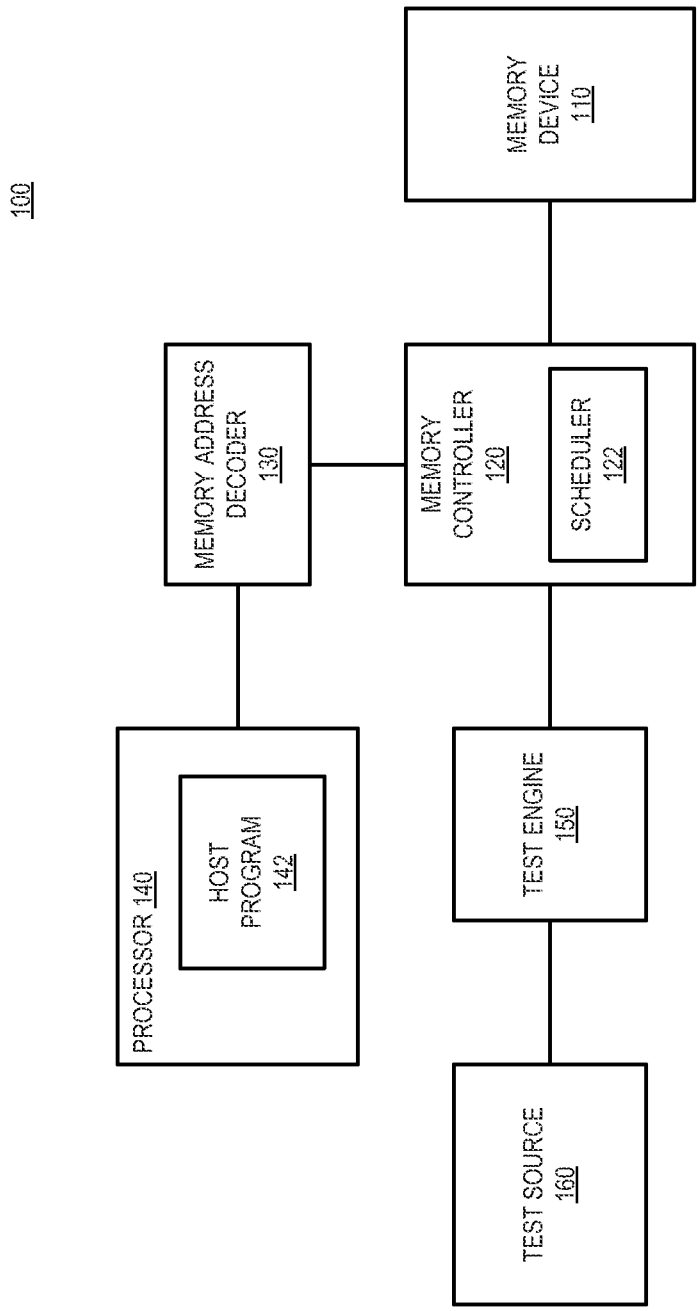
FIG. 1 is a block diagram of an embodiment of a system having a test engine that provides testing on a transaction level.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a memory subsystem includes a test signal generator of a memory controller that generates a test data signal in response to the memory controller receiving a test transaction. The test transaction indicates one or more I/O operations to perform on an associated memory device. In one embodiment, the test signal generator generates data signals from various different pattern generators. The memory controller scheduler schedules the generated test data signal pattern, and sends it to the memory device. The memory device can then execute I/O operation(s) to implement the test transaction.

In one embodiment, the memory controller reads back data written to a specific address of the memory device and compares the read back data with expected data. When the read back data and the expected data do not match, the memory controller can record an error. The error can include the specific address of the error, the specific data, and/or encoded data.

As described herein, a test system includes hardware elements located in and/or near the memory controller (e.g., on a shared die space, on a SoC (system on a chip)). The test system can create precise combinations of I/O (input/output) that result in I/O-induced power supply noise, inter-symbol interference (ISI), signal crosstalk, and/or other conditions. Any of these effects can be created by precisely controlling the data on each I/O lane and how the data signals align with each other across lanes.

In one embodiment, the test system is configured to create any of a variety of test pattern signal conditions, which enables the test system to create the desired effects to test the memory subsystem. Such pattern signal conditions can include: pseudo random patterns on all lanes; applying one pattern to a victim lane while adjacent aggressor lanes get a different pattern, which can further include rotating the victim lane; driving a single frequency tone pattern to excite resonances; combinations of resonance patterns and pseudo random patterns to simultaneously create supply noise and ISI/crosstalk; fixed-pattern hardware training modes (e.g., providing a fixed 1010 pattern for read training), and/or others. In one embodiment, the test system can generate a fixed pattern that allows software to control the values on every lane in every cycle independently to find a worst case pattern via advanced search techniques. In addition to the ability to generate each of the pattern conditions mentioned, the test system sits close to the memory controller scheduler, which enables the test system to generate all of the pattern types at high speed in hardware.

In one embodiment, a test engine is located prior to the memory controller in the data/request path to test data and commands by injecting memory access transactions into the memory controller. As described herein, a test system generates test patterns to provide to the memory controller. Such test pattern generation can be used in conjunction with the test engine located prior to the memory controller to generate the patterns to implement the injected transactions. In one embodiment, the test system pattern generation can be used in conjunction with a software test executed by the host controller. In such a case, the software itself can be very minimal, and rely on the capabilities of the test system to generate the test traffic, including high-stress traffic conditions.

In one embodiment, the test system generation is performed by leveraging a write data buffer or comparable structure on or near the memory controller. Description herein is made in reference to a write data buffer, but such descriptions will be understood to apply equally to a comparable array structure where rows and columns of bits can be selected to generate patterns as described herein. In one embodiment, the write data buffer or comparable structure acts as a lookup table to generate Boolean functions of the select lines of the array. In one embodiment, the pattern generation includes incrementing through lines of the buffer array to allow for multiple stress patterns. In one embodiment, the test system includes logic to save and/or restore state from a pattern selection generator (PatternSelGen).

The principal way commonly used to test memory devices is to write data into memory and then read it back to check if the data was written correctly. The test system as described herein provides data to be scheduled by the scheduler of the memory controller. As a result, any test traffic is sent to the memory device in a way compliant with memory device access protocol. Thus, errors in the reading back should indicate actual errors in the memory subsystem.

Regarding memory subsystem error detection, previous test systems did not record sufficient error data to adequately provide cell array testing and correction. In one embodiment, the test system reads back written test data, compares it to expected data, and records any errors with address information. Data errors can be logged as one or more of the following: received data, expected data, or received data XOR expected data. The test system can record multiple errors. With the recording of multiple errors, along with address information, the test system enables more specific error identification, which enables correcting at least some errors.

With reference to a test engine that can operate in conjunction with or in parallel with the test system pattern generation described herein, the test engine as described herein can inject transactions (e.g., read, write, maintenance command) directly into the memory controller, bypassing a memory address decoder. Passing the transactions to the memory controller after the memory address decoder enables the test engine to operate at the level of specific memory address (e.g., rank, bank, row, and column) and create precisely targeted tests that focus on specific locations in the memory device. However, because the test engine operates on the transaction level, the test operations (embodied in the transactions created) still go through the normal memory controller and scheduler. The memory controller generates specific memory device commands from the transactions.

In one embodiment, consider that a transaction indicates to read a cacheline from memory. Depending on the current state of memory, such a read may require a given page of memory to be precharged, a new page activated based on the row address of the read command, and the actual read command to be issued. The precharging, activating, and reading is supposed to take place with the appropriate timing per a memory protocol for the memory device. In another embodiment, consider that a transaction indicates a read where the appropriate page in memory is already open, which may only require a read command to the appropriate column to access the data. In general, the memory access transactions indicate to the memory controller what to do, but not how to do it. The memory controller controls tracking the current state of memory and how to access a location based on the current state of memory. Thus, the memory controller determines how to Activate and/or Precharge the proper pages, issue appropriate CAS/RAS commands, obey all relevant timing related to accessing the memory device, and otherwise comply with memory device access protocols.

By operating at the transaction level and allowing the memory controller to generate the memory device commands and timing, the testing is easier to write, and yet at the same time more accurately reflects how the memory subsystem operates (it is "correct by construction"). The test engine cannot do anything that the memory controller would not normally do, or request the memory device to perform an operation that would be considered illegal under access protocol(s). Such capability is in contrast to both the traditional software testing and hardware FSMs used in testing. The "correct by construction" nature of the test engine described herein gives increased confidence that any failures detected by the test engine are real failures and not simply the result of incorrect test setup.

In one embodiment, the test engine is configured by software to output a specific sequence of transaction, walking through different address ranges with write and/or read transactions. The software can be run either locally at the host device in which the memory controller and memory device are found (e.g., through a core or microcontroller on the platform) or remotely (e.g., by a remote host via a debug port). In one embodiment, the test engine supports both local and remote software execution to provide a test instruction. Remote host testing can provide remote validation during debug or during post-manufacturing testing. Local testing can be performed for self-testing purposes, for example, by a BIOS (basic input/output system) or operating system (OS) verification software. In one embodiment, the testing could be used by BIOS to optimize the performance of the command bus in the specific system. For example, the BIOS can center the strobe in the middle of the data eye, center a VrefDQ used to distinguish a 1 from a 0 on the data bus, and/or optimize transmitter/receiver behavior for a given system.

As described herein, the test engine is deterministic and controllable. The determinism can be further leveraged by the logic buffer described herein. In one embodiment, the test engine is dynamically controllable. The determinism refers to an expectation that repeatedly running the same test will generate exactly the same sequence of activity on the memory command bus and data bus in a cycle-accurate manner. The controllability refers to being able to control the behavior of the system with precision (e.g., causing specific behavior at specific cycles). The test engine creates different memory conditions with the transactions created and passed to the memory controller. In one embodiment, the test engine enables support to synchronize with power down modes, refreshes, ZQ calibration, and maintenance commands. The synchronization can enable the test engine to place the memory controller in a deterministic state prior to starting a test. In one embodiment, the test engine can reset all or part of the memory controller, by resetting one or more counters or setting the counters to a programmable value.

In one embodiment, the test engine is dynamically configurable, which can allow it to test for multiple different worst case scenarios to more fully validate I/O performance in the memory subsystem. The test engine can provide specific patterns that test specific cases of memory device circuit marginality. Thus, the test engine can create precisely targeted, high bandwidth tests. In one embodiment, the test engine can generate multiple test signals in parallel to send to the memory controller to have the memory controller schedule and test multiple different regions of memory at the same or substantially the same time. For example, certain test engine transactions can generate commands for different areas of memory that are sent out by the memory controller before the testing of the other area is completed.

The test engine as described herein can be used to test memory devices. Any memory subsystem that uses a memory controller with a scheduler or equivalent logic can implement at least one embodiment of the test engine. Similarly, a logic buffer or equivalent component as described herein can be configured to work with any memory subsystem that uses a memory command bus to send memory device commands. Reference made herein to memory devices can include different memory types. For example, memory subsystems commonly use DRAM, which is one example of a memory device as described herein. Thus, the test engine described herein is compatible with any of a number of memory technologies, such as DDR4 (dual data rate version 4, specification in development as of the filing of this application), LPDDR4 (low power dual data rate version 4, specification in development as of the filing of this application), WIDEIO (specification in development as of the filing of this application), and others.

It will be understood that in a memory device, rows that are physically adjacent can often be logically labeled differently from one manufacturer to another. Similarly, columns that are physically adjacent can be logically labeled differently from one manufacturer to another. Typically a manufacturer maps logically adjacent rows and columns of memory by a physical address offset, and the offsets can be different among different manufacturers. The offsets are not necessarily the same for rows and columns. For example, an N-bit address can be used to access a particular row of the memory. In the simplest case, the adjacent row can be accessed by toggling AddressBit[0]. However, in other implementations, the memory device can be physically organized differently such that AddressBit[x] indicates the adjacent row. In still other implementations, a combination of several bits is combined in a hashing function to find the adjacent row. By providing bit swizzling and hashing functions in the hardware, the test engine can remap the logical test engine address to a physical memory device addresses to ensure the test is accessing the physical adjacent rows and/or columns for tests that rely on row/column adjacency. Accessing the array in a specific order based on physical organization may be critical to finding certain classes of failures.

The memory device itself is configured to determine how to map access requests to the physical memory resources. Memory controllers are generally designed to be compatible with many different types of memory devices, and so they are generally not designed specifically with respect to any particular manufacturer's device. Thus, memory controllers do not traditionally have logic or information to indicate what rows or columns are physically adjacent. In one embodiment, the test engine can be configured with logic that takes into account the specific offsets of a particular memory device. In one embodiment, the test engine can be specific to a particular memory device. In one embodiment, the test engine can be generic with respect to multiple different memory devices.

FIG. 1 is a block diagram of an embodiment of a system having a test engine that provides testing on a transaction level. System 100 includes components of a memory subsystem (memory device 110, memory controller 120, and memory address decoder 130) coupled to a test engine (coupled to memory controller 120) and a host processor (coupled to memory address decoder 130). Test engine 150 enables deterministic memory testing in system 100. In one embodiment, test engine 150 is implemented in the same hardware as memory controller 120 (e.g., in the same die space, or as an SoC with the memory controller die).

Memory device 110 represents any type of memory device with addressable memory locations. Memory address decoder 130 receives a memory access request from processor 140, and determines a specific memory address to fulfill the request. It will be understood that processor 140 may not be directly coupled to memory address decoder 130. However, access requests in system 100 are generally create by processor 140, and pass through memory address decoder 130 for resolution of a specific physical location of memory device 110 as identified by a specific address. Host program 142 represents any one or more software processes executed by processor 140 from which a memory access request can be generated. In one embodiment, processor 140 is a graphic processor, a video display processing component, or a processing component that receives data or instructions from a device external to system 100. Thus, host program 142 can include agents or processes that create memory access transactions that are not necessarily executed by a host processor.

Memory address decoder 130 generates memory access transactions to fulfill the access requests. Memory controller 120 receives the memory access transactions and determines what specific memory device commands to execute to comply with protocol and design configuration of memory device 110 to fulfill the access requests. Memory controller 120 schedules the specific memory device commands with scheduler 122. In one embodiment, memory controller 120 performs out-of-order scheduling, which means that memory access transactions can be resolved into multiple memory device commands, and executed in an order selected by memory controller 120 instead of an order in which they are passed by memory address decoder 130. Memory address decoder 130 can potentially generate the transactions out of order from the requests received from host processor 140. Thus, there is no guarantee of the order of execution of memory access requests made through memory address decoder 130.

Test engine 150 bypasses memory address decoder 130 and generates transaction-level access requests for memory controller 120 to schedule. It will be understood that test engine 150 does not bypass the scheduling path of memory controller 120. Like memory address decoder 130, test engine 150 generates and passes memory access transactions with specific addresses.

Test engine 150 receives one or more memory test instructions or software commands from test source 160. Test source 160 can be any sources of a number of different sources. For example, in the case of a production-level test or during debugging, a test fixture or other external (which can also be referred to as remote) processor or system can send a test instruction via a debug port or other interface to test engine 150. The external system can be referred to as a remote test administrator system, including a processor to issue the instructions. Alternatively, test source 160 could be a microcontroller local to a host computing platform of system 100 (e.g., a "motherboard" or other platform on which processor 140 and its peripheral interfaces reside). Test source 160 could be a test system coupled to a peripheral bus of system 100. In one embodiment, test source 160 is a BIOS of system 100.

In one embodiment, test engine 150 is configurable to execute different memory tests. Thus, test source 160 can provide one or more instructions to cause test engine 150 to generate one or more transactions consistent with one memory test, and then provide one or more different instructions to cause test engine 150 to generate one or more transactions consistent with a different memory test. Responsive to receiving a software command from test source 160, test engine 150 generates the one or more transactions to execute a test indicated by test source 160. Test engine 150 passes the transaction to memory controller 120, which in turn, schedules one or more memory device commands to memory device 110. Memory device 110 will thus carry out the transaction provided by test engine 150.

In one embodiment, test engine 150 is implemented as a hardware finite state machine (FSM). Test engine 150 can be a dynamically programmable hardware FSM. The ability of test engine 150 to provide deterministic testing via the transaction-level testing enables running various different test scenarios. Examples of different test cases can include the following.

In one embodiment, test engine 150 performs a turnaround time test. A turnaround time test detects issues related to how long it takes the system to switch at speed between different physical devices of the memory. For example, if commands are issued too close together, a new command can corrupt a command already on the line that has not been fully received and processed by the target device. In one embodiment, test engine 150 allows for walking across a programmable sequence of ranks and/or banks. Walking across the sequence allows testing of different combinations of read and/or writes to different ranks, while hitting all combinations of turnarounds. In one embodiment, test engine 150 tests minimum specified turnaround times to provide the highest stress timing that schedule 122 allows.

Table 1 illustrates one example of an embodiment of a test sequence that walks across all ranks in a system with four ranks, hitting various combinations of write-write or read-read. Such a test can test, for example, different DIMM turnarounds. Different combinations may be of interest for different failure modes under test. It will be understood that the test operates from left to right, and could be extended out further to the right. While write-write and read-read combinations are illustrated, similar sequences are possible for write-read and/or read-write. In one embodiment, test engine 150 walks across ranks in a linear order (referred to as a logical rank), and is consistent in walking across the same logical rank. Thus, test engine can walk across all ranks in a logical order. In one embodiment, test engine 150 includes a fully programmable mapping between the logical rank and physical rank, which enables it to issue transactions targeted to desired physical memory locations. It will be understood that scheduler 122 sees the physical ranks, but would typically not see the logical rank. Test engine 150 can thus cover an arbitrary sequence of ranks in a memory test. It will be understood that a similar test could be programmed to provide a physical bank mapping, which can map between logical bank and physical bank. Thus, the test engine could perform a walk-through test on a sequence of banks.

TABLE 1

Example turnaround testing with logic rank

| Rank Order | | | | | | | 0 | 2 | 1 | 3 | 0 | 3 | 1 | 2 | |
|---|---|---|---|---|---|---|---|---|---|---|---|---|---|---|---|
| Operation | W | W | W | W | W | W | W | W | R | R | R | R | R | R | R | R |
| Rank | 0 | 2 | 1 | 3 | 0 | 3 | 1 | 2 | 0 | 2 | 1 | 3 | 0 | 3 | 1 | 2 |
| Turnaround | | 01 | 21 | 13 | 30 | 03 | 31 | 12 | | 01 | 21 | 13 | 30 | 03 | 31 | 12 |

In one embodiment, part of generating the memory test includes performing a logical-to-physical address mapping, mapping the logical address. The logical-to-physical address mapping can include logical column address to a physical column address, logical row address to physical row address, logical rank address to physical rank address, logical bank address to physical bank address, or a combination of these. The mapping can be achieved via swizzling different bits, combining multiple bits together in a hashing function, the use of a fully programmable mapping table on all or a subset of the bits, or some other mechanism to map addresses.

In one embodiment, test engine 150 performs a power down mode test. In one embodiment, test engine 150 provides the ability to insert a programmable wait time at any point during a test. By adjusting the wait time and scheduler parameters, test engine 150 can enable memory controller 120 to enter all possible power down modes including APD (automatic power down), PPD (precharged power down), Self-Refresh, and/or other internal power down modes such as package C-states. Thus, test engine 150 can target testing to cover entering and exiting power down modes with the most aggressive possible timing, while also providing programmable traffic around the enter and/or exit.

In one embodiment, test engine 150 performs a refresh test. In one embodiment, test engine 150 injects periodic refreshes into scheduler 122 as needed to either maintain memory device cell contents, or to create worst case power supply noise. The refreshes consume significant dI/dt or current surges, which is known to cause power supply noise. Test engine 150 can inject the refreshes at a deterministic, programmable time relative to the start of the test. In one embodiment, test engine 150 can cover different types of refreshes as supported by memory device 110 (for example, some memory device specifications allow per bank refreshes, or all rank refreshes, as well as others).

In one embodiment, test engine 150 performs a test of ZQ calibration. In one embodiment, test engine 150 can inject periodic ZQ calibration commands into scheduler 122 as needed to maintain the ZQ compensation and/or test any potential issues with variation in the termination resistor calibration of memory device 110. Test engine 150 can inject ZQ calibration commands at a deterministic, programmable time relative to the start of the test. In one embodiment, test engine 150 can cover different types of ZQ calibration as supported by a specification of memory device 110 (for example, long versus short).

In one embodiment, test engine 150 performs a register test, such as a Mode Register write (MRW) or a Mode Register read (MRR). In one embodiment, test engine 150 can inject mode register writes and/or reads into scheduler 122 to cover any possible combination of these commands with other commands. Providing register transactions from test engine 150 can also provide coverage for functional modes that may require doing register read and/or write commands.

In one embodiment, test engine 150 performs an error recovery test. It will be understood that because test engine 150 passes access transactions to memory controller 120 to be scheduled by scheduler 122, error recovery in system 100 will occur as in runtime operation of system 100. Thus, in the case of an error, such as parity error or CRC (cyclic redundancy check) error in memory device 110, scheduler 122 can respond as in operation, such as retrying transactions.

It will be understood that the different tests for ZQ calibration, registers, power down, or error recovery can be combined with other types of tests, as well as with each other. Other test scenarios are possible. In general, test engine 150 can enable full testing of the I/O for training (e.g., I/O performance, memory power), electrical validation, system validation, and/or self-test or repair (e.g., I/O or memory cell).

Figure 2:
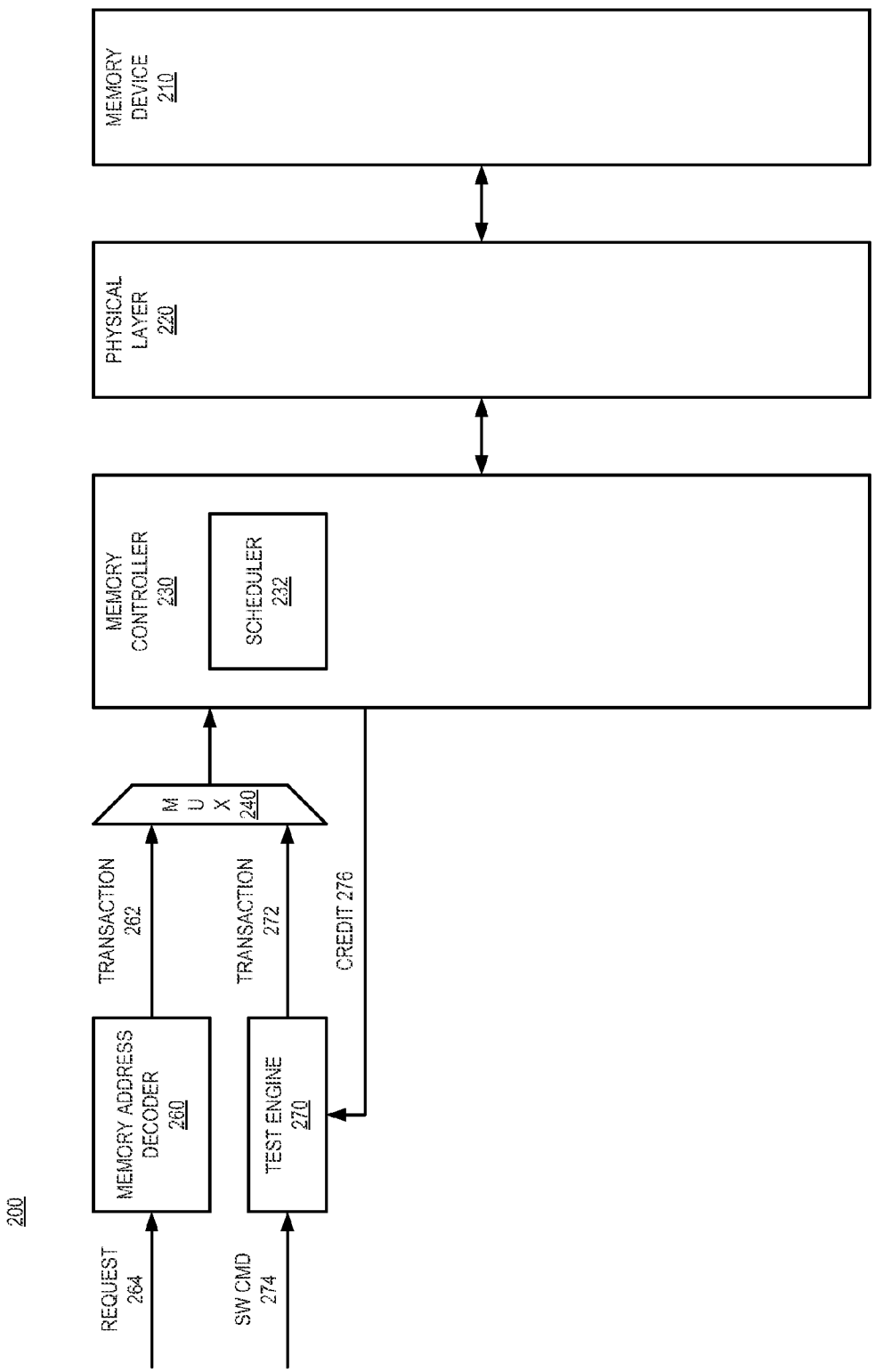
FIG. 2 is a block diagram of an embodiment of a system having a test engine that provides transaction-level testing multiplexed to a memory controller with a memory address decoder.

FIG. 2 is a block diagram of an embodiment of a system having a test engine that provides transaction-level testing multiplexed to a memory controller with a memory address decoder. System 200 is one example of an embodiment of a system with a test engine in accordance with any embodiment described herein, such as system 100 of FIG. 1. Memory device 210 stores data and/or instructions for execution by a processor (not specifically shown). The operation of memory device 210 is tested by test engine 270.

Physical layer 220 provides the architecture to connect multiple memory devices 210 to memory controller 230. Physical layer 220 can include registers, physical buses, and other components of a memory device that handle I/O (input/output) to/from memory device 210. For example, physical layer 220 can include components of a dual inline memory module (DIMM), which can include multiple individual DRAMs.

Memory controller 230 is a memory controller in accordance with any embodiment described herein, and includes scheduler 232. Memory controller 230 generates memory device commands for memory device 210 to execute. Scheduler 232 schedules the memory device commands generated in response to the memory access transactions received at memory controller 230.

Memory address decoder 260 provides a standard path for memory requests to reach memory controller 230, for example, from a host processor. Memory address decoder 260 receives request 264 from a source such as the host processor. Request 264 generally includes an access command and address information. The address can be a logical address, which does not identify the actual physical address of the memory location(s) to which the memory access is directed. Memory address decoder 260 includes logic that enables it to resolve the physical address from the virtual address information to create transaction 262. In one embodiment, transaction 262 includes a command identifier, and identifies the specific rank, bank row, and column for the command.

System 200 includes test engine 270, which receives software command 274 from a test source, and generates memory access transactions 272 for scheduling by memory controller 230 and execution by memory device 210. In one embodiment, transactions 272 are of the same form as transactions 262, with a command identifier (e.g., a read identifier or write identifier), and identifier for the specific rank, bank row, and column for the command. In one embodiment, memory controller 230 generates credit 276 as feedback to test engine 270. Memory controller 230 can use credit 276 to provide indicators of the timing of processing transaction 272. Thus, for example, memory controller 230 can indicate when a transaction has been processed.

In one embodiment, test engine 270 uses credit 276 to control the determinism of the testing. For example, test engine 270 can use a single credit policy in that it will only send out one transaction or command at a time. In one embodiment, test engine 270 waits to send out a subsequent transaction until memory controller 230 returns credit 276 indicating the first transaction has been issued. Thus, even if scheduler 232 uses out of order scheduling or just in time scheduling, test engine 270 can send one transaction at a time, which ensures that scheduler 232 will not reorder the test.

It will be understood that a credit return generally could be accomplished in different ways, depending on the memory controller architecture and specific sequences of transactions or commands. In one embodiment, memory controller 230 returns credit 276 after a Read or Write CAS command is generated. Alternatively, memory controller 230 can generate credit 276 from an Activate command, or other memory device command or internal scheduler event. Test engine 270 could simply wait a period of time between sending transactions, without the need for credit 276. However, in such an implementation a full bandwidth deterministic test of the memory device may not be possible.

In one embodiment, a sophisticated credit feedback mechanism is used between memory controller 230 and test engine 270. For example, feedback can be provided under certain circumstances for specific events (e.g., internal scheduler events), and/or feedback specific to a physical memory location (e.g., per rank), and/or some other mechanism. With a more sophisticated credit return policies, test engine 270 can generate transactions in parallel for different portions of the memory, or different conditions to affect memory device 210, and thus, provide a higher bandwidth test of memory device 210. Such a higher bandwidth test can test the highest possible memory bandwidth allowable by a specification for memory device 210 and/or allowable by the design or specification of memory controller 230.

In one embodiment, system 100 includes multiplexer 240 or equivalent logic (e.g., logic within memory controller 230) to select between transaction 262 of memory address decoder 260 or transaction 272 of test engine 270. Although the expression "multiplexed" may be used, it will be understood that if the operation of memory address decoder is temporarily suspended, and/or higher-level operations at the processor level are suspended to prevent issuing of memory access requests, transaction 272 can be the only input available during testing. Thus, in one embodiment, mux 240 can be implemented as a simple buffer that can be written by either memory address decoder 260 or test engine 270. Alternatively, mux 240 can be a multiplexer that selects between transaction 262 and transaction 272 responsive to a set signal (not explicitly shown). Such a signal could be generated, for example, by test engine 270 or an external signal controllable by the test source. In one embodiment, such a set signal could be used as a security feature to prevent access to the test engine by malicious code that could be trying to access protected memory contents through the test engine, which it would otherwise not have access to. Thus, selecting the multiplexer can be understood in one embodiment as providing security to the test engine.

Figure 3:
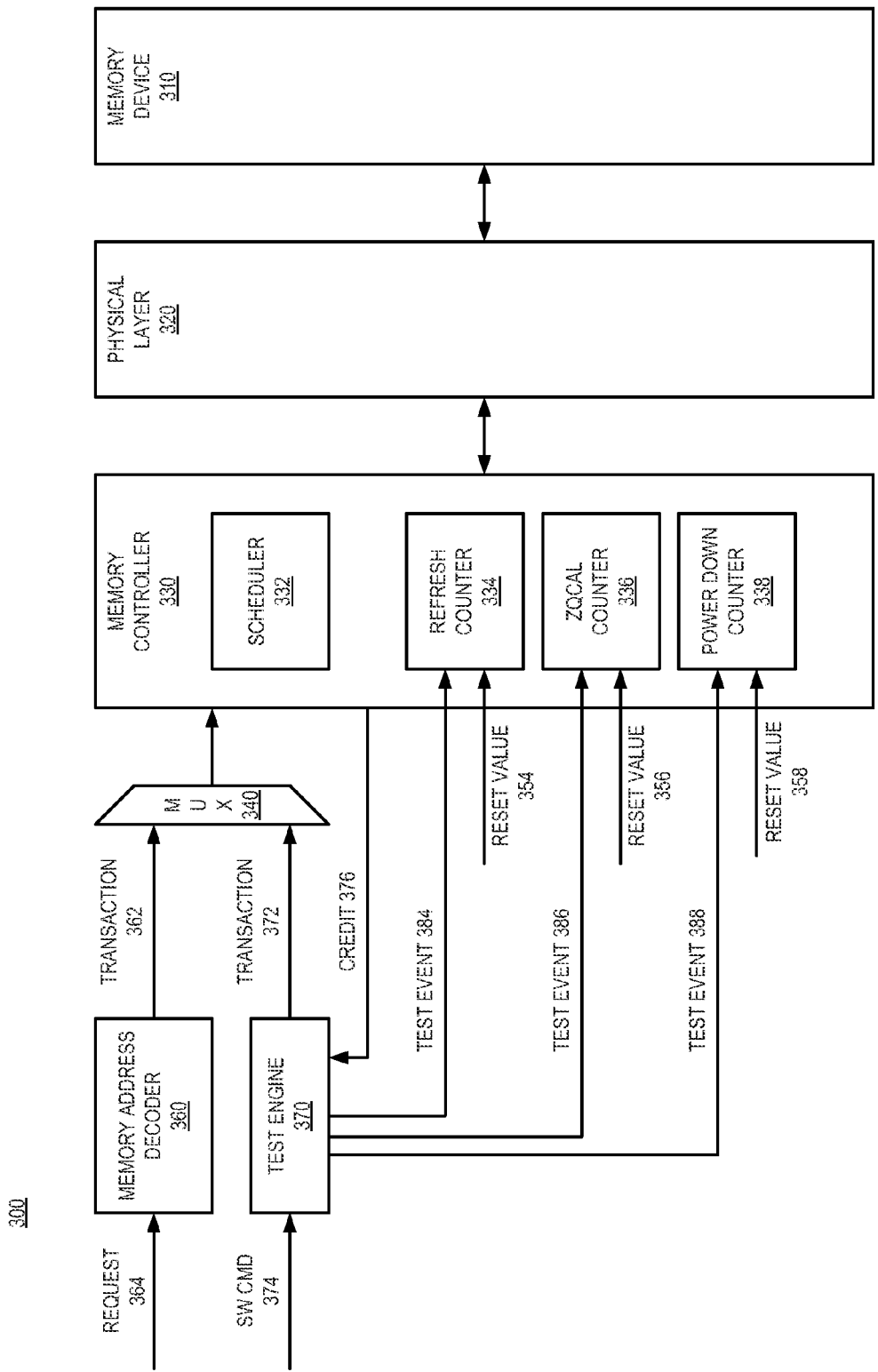
FIG. 3 is a block diagram of an embodiment of a system having a test engine that provides transaction-level testing including the ability to reset memory controller counters.

FIG. 3 is a block diagram of an embodiment of a system having a test engine that provides transaction-level testing including the ability to reset memory controller counters. System 300 is one example of an embodiment of a system with a test engine in accordance with any embodiment described herein, such as system 100 or system 200. Memory device 310 stores data and/or instructions for execution by a processor. The operation of memory device 310 is tested by test engine 370.

System 300 includes memory device 310, physical layer 320, memory address decoder 360, and test engine 370. Each component corresponds to a component of system 200, and the description above with respect to those components applies to system 300. In one embodiment, system 300 includes mux 340, which can be the same as mux 240 of system 200 discussed above. Memory address decoder 360 receives request 364, and generates transaction 362 in response to the request, where transaction 362 includes specific address information. Test engine 370 receives software command 374, and in response to the instruction generates one or more transactions 372. In one embodiment, system 300 utilizes credit 376 to provide feedback from memory controller 330 to test engine 370.

Memory controller 330 includes scheduler 332, which can be similar to scheduler 232 of system 200. Memory controller 330 can use credit 376 to provide indicators of the timing of processing transaction 372, and for example, can indicate when a transaction has been processed.

In one embodiment, memory controller 330 includes one or more counters. Examples include, but are not limited by, refresh counter 334, ZQCal counter 336, and power down counter 338. In one embodiment, test engine 370 performs a reset of memory controller 330 in conjunction with a memory test. The reset can include resetting all counters of memory controller 330, or can include selectively resetting certain counters. In one embodiment, test engine 370 generates a reset in response to an event from within test engine 370, such as part of a test, or in response to a condition detected by test engine logic. In one embodiment, test engine 370 generates a reset of the memory controller in response to an event in memory controller 330, such as the execution of a command, or the occurrence of an alert, interrupt, error, or other condition.

Refresh counter 334 represents a counter that controls timing for performing a refresh of one or more memory resource of memory device 310. ZQCal counter 336 represents a counter that controls a configuration of a termination resistor. Power down counter 338 represents a counter that controls timing related to a power down event. It will be understood that not only could there be other counters, there can be multiples of each counter type (e.g., multiple power down counters).

In one embodiment, test engine 370 provides reset control of refresh counter 334 via test event 384, control of ZQCal counter 336 via test event 386, and control of power down counter 338 via test event 388. It will be understood that each of test events 384, 386, and 388 could be the same test event. For example, test engine 370 could generically reset all counters when it is to reset one counter for a specific memory test. Test events 384, 386, and 388 could be signals provided directly from test engine 370. In one embodiment, one or more test events 384, 386, and 388 are signal provided by scheduler 332. Both test engine 370 and scheduler 332 can generate test events based on test synchronization requirements and ease of implementation.

Generally resetting of a counter is thought of as resetting the counter to zero. In one embodiment, one or more of the counter are reset to a programmable reset value specific to the counter and/or specific to a particular test or test event. Thus, reset value 354 is shown as an input to refresh counter 334, reset value 356 is shown as an input to ZQCal counter 336, and reset value 358 is shown as an input to power down counter 338. It will be understood that reset values 354, 356, and 358 could alternatively be replaced with programmable delays on a corresponding test event signal (test events 384, 386, and 388, respectively). Thus, if specific test event signals are used for the different counters, test engine 370 could simply control when a reset is generated for a specific counter to produce a desired value at a specific point in the test. Alternatively, the counter can be reset and then set to a specific non-zero counter value.

Figure 4:
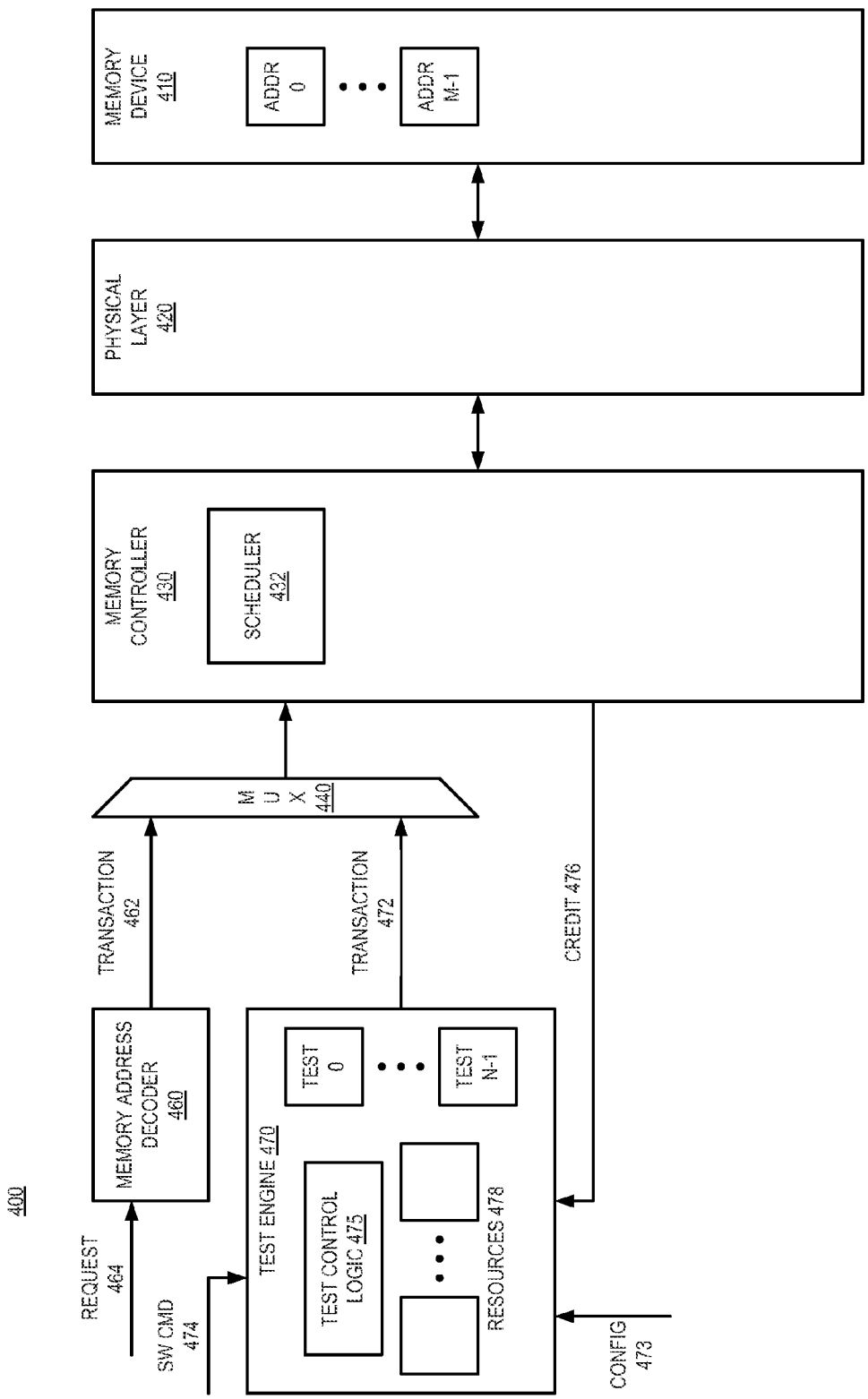
FIG. 4 is a block diagram of an embodiment of a system having a test engine with configurable hardware resources that provides transaction-level testing.

FIG. 4 is a block diagram of an embodiment of a system having a test engine with configurable hardware resources that provides transaction-level testing. System 400 is one example of an embodiment of a system with a test engine in accordance with any embodiment described herein, such as systems 100, 200, or 300. Memory device 410 stores data and/or instructions for execution by a processor. The operation of memory device 410 is tested by test engine 470.

System 400 includes memory device 410, physical layer 420, memory address decoder 460, and test engine 470. Each component corresponds to a component of system 200, and the description above with respect to those components applies to system 400. In one embodiment, system 400 includes mux 440, which can be the same as mux 240 of system 200 discussed above. Memory address decoder 460 receives request 464, and generates transaction 462 in response to the request, where transaction 462 includes specific address information. Test engine 470 receives software command 474, and in response to the instruction generates one or more transactions 472. In one embodiment, system 400 utilizes credit 476 to provide feedback from memory controller 430 to test engine 470.

Memory controller 430 includes scheduler 432, which can be similar to scheduler 232 of system 200. Memory controller 430 can use credit 476 to provide indicators of the timing of processing transaction 472, and for example, can indicate when a transaction has been processed.

In one embodiment, test engine 470 includes dynamically configurable hardware resources 478. For example, in one embodiment, test engine 470 includes one or more configurable/programmable logic arrays or configurable logic devices. It will be understood that configurable/programmable logic devices can be configured via software control. As mentioned above, the software control can be through a local device, or via a remote administration device. Thus, in one embodiment, configuration (config) 473 is provided by the test source that generates software command 474. In one embodiment, configuration 473 represents a setting of one or more registers or configuration controls in test engine 470, and software logic to program test engine resources 478 can come from a storage device (not shown).

Resource 478 can be used to implement any of a number of different tests, and the configuration of the resources can be different for the different tests, although some configuration settings may overlap between tests. In one embodiment, resources 478 are arranged to implement different FSMs in response to configuration 473.

Memory device 410 has memory elements (e.g., cells) with addresses ADDR0 through ADDR(M−1). The M addresses could be the range of all addresses in memory device 410, or alternatively could be a range less than the whole device over which a test sequence is to be iterated.

Test engine 470 is shown to include test0 through test(N−1). The N tests can represent different iterations through the same test (e.g., the same test transaction with N different addresses), in which case N and M could be considered equal. The N tests can represent N different tests that are each iterated through the M addresses. As illustrated, test engine 470 includes N different configurations of resources 478 to execute the N different tests. Configuration 473 is provided to configure the N different test setups of resources 478. In one embodiment, a single software command 474 operates to cause test engine 470 to generate M transaction 474 to iteratively test ADDR0 through ADDR(M−1). In one embodiment, multiple tests are generated and passed to the memory controller to be executed in parallel.

In one embodiment, the address range M can be decomposed further into {Rank[Ra−1:0], Bank[B−1:0], Row[R−1:0], Column[C−1:0]} starting and stopping addresses for a test, where the rank, bank, row, and column are understood to be of sizes Ra, B, R, and C, respectively. It will be understood that hardware can adjust the Row/Column/Bank range based on exact organization for each rank of memory device 410 (e.g., a 2 Gb DRAM will have a different number of rows than a 4 Gb DRAM). It will be understood that hardware can adjust the Rank range based on the exact system population (e.g., a system could be populated with single rank or quad rank DIMMs). In one embodiment, test engine 470 includes test control logic 475, which represents logic that enables test engine to modify its configuration based on configuration signal 473. Test control logic 475 manages the configuration of resources 478.

The setting value of {Rank, Bank, Row, Column} indicate specific addresses. In one embodiment, the addresses can be incremented by Rate and Value, which could each be signed numbers. In one embodiment, test engine 470 includes address increment logic (e.g., implemented in resources 478. The address increment logic can support various options. In one embodiment, test engine 470 via address increment logic can generate a test sequence where every Rate transactions, the address is incremented by Value. In one embodiment, test engine 470 via address increment logic can generate a test sequence where every Rate sequences or subsequences, the address is incremented by Value. In one embodiment, test engine 470 via address increment logic can generate a test sequence where a wrap on one subfield of the address can cause an increment on a different subfield. For example, when column reaches its stop point and wraps around, it could cause the row to increment. This can also be done in multiple dimensions to allow for more complex tests that walk along diagonals (for example, simultaneously incrementing both row and column).

In one embodiment, test engine 470 periodically inverts {Rank, Bank, Row, Column} at a programmable rate to stress the decoding logic of memory device 420 (e.g., decoding logic in physical layer 420). A test sequence can indicate a list of Subsequences enabled for a particular test, and a number of times to loop through the Subsequences. In one embodiment, test engine 470 includes logic to determine whether to use a fixed number of transactions, or base sequence transition on an address wrap.

In one embodiment, test engine 570 increments the {Rank, Bank, Row, Column} in a way that the address changes in a pseudo random fashion instead of a simple linear fashion while still covering the entire address range. In one embodiment, the counter could be replaced with a linear feedback shift register of the appropriate length to randomly change all the address bits on each increment. In another embodiment, more sophisticated random number generators could be utilized to provide better coverage of a wide variety of defects with a single test.

In one embodiment, a Subsequence defines how many transactions the Subsequence should perform. The Subsequence can also define what type of transaction the Subsequence should do, such as Base Read, Base Write, Base Read followed by a Write, Base Write followed by a Read, Offset Read, Offset Write, or other transaction type. In one embodiment, test engine 470 can generate one or more offset transactions, which apply an offset to a current {Rank, Bank, Row, Column} address. The offset can enable tests that stress the memory device cell at the current address by accessing nearby cells. For example, test engine 470 can apply a range of different offsets where the test will read all memory addresses within ±X rows of the current address. In one embodiment, test engine 470 can apply offsetting to multiple dimensions of the address, allowing for accesses within a programmable-sized hypercube of the current address.

It will be understood that test engine 470 can generate inverted data transactions based on a number of transactions or certain bits of the address. The use of inverted data transactions provides a simple way to create stripes or checkerboard data patterns useful in memory tests.

Figure 5A:
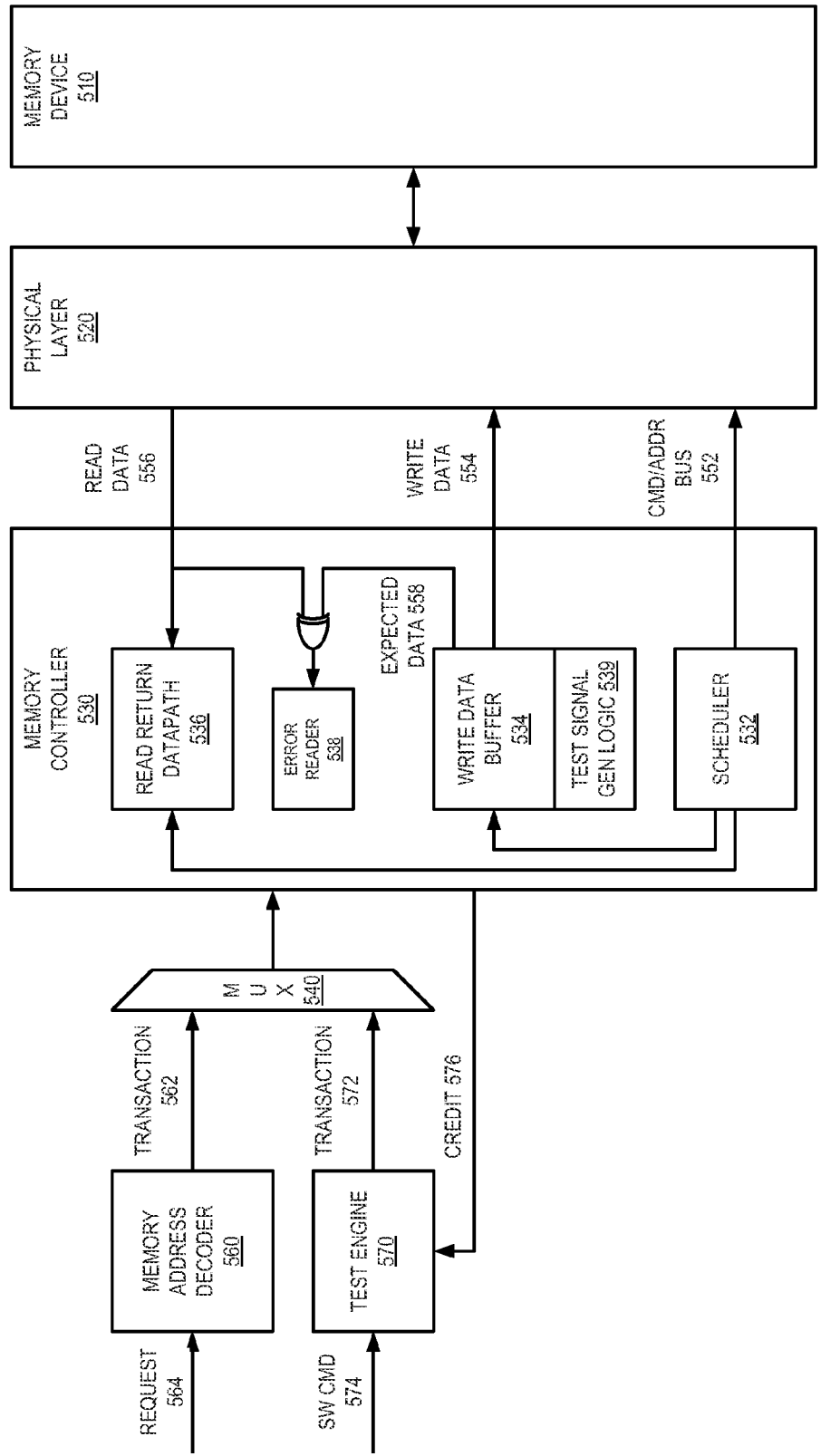
FIG. 5A is a block diagram of an embodiment of a system having a write data buffer coupled to the data bus to provide a signal pattern on the data bus.

FIG. 5A is a block diagram of an embodiment of a system having a write data buffer coupled to the data bus to provide a signal pattern on the data bus. System 502 is a memory subsystem and is specifically shown including test engine 570, but test engine 570 is optional in one embodiment of system 502. In an embodiment where test engine 570 is included, test engine 570 can be a test engine in accordance with any embodiment described herein. In one embodiment, system 502 is one example of a system in accordance with any embodiment of systems 100, 200, or 300, with or without a test engine.

Thus, memory device 510 stores data and/or instructions for execution by a processor. Physical layer 520 includes interconnections, registers, and other logic and physical interfaces between memory controller 530 and memory device 510. Memory controller 530 interfaces between a processor or other source of memory access requests (not specifically shown in system 502). Memory controller 530 processes and maps memory access requests to memory device commands executed by memory device 510 to access specific physical resources. Memory address decoder 560 receives request 564, maps the request to physical memory locations in transaction 562, and forwards the memory access transaction to memory controller 530 for processing and scheduling. In one embodiment, memory address decoder 560 is considered part of memory controller 530. In one embodiment, memory address decoder 560 is on the same die as memory controller 530.

In one embodiment, test engine 570 receives software command 574 and generates memory access transactions 572 to simulate traffic to memory device 510. Transaction 572 can be controlled for specific access patterns and traffic load to perform tests on memory device 510. In one embodiment, test engine 570 is part of memory controller 530, and/or is on the same die or embedded in the same chip as memory controller 530. Mux 540 can select between transactions 562 and 572 generated by memory address decoder 560 and test engine 570, respectively. Selection control of mux 540 can be controlled by a test administrator software command (not specifically shown), or by the test engine itself. Credit 576 represents synchronization feedback that memory controller 530 can provide to test engine 570. Memory controller 530 uses scheduler 532 to schedule (e.g., control ordering and timing of commands, implement an access protocol) memory device commands to send to memory device 510 (e.g., via physical layer 520).

Memory controller 530 is illustrated as having command/address bus 552 between it and physical layer 520 and memory device 510. Memory controller 530 is also connected to physical layer 520 and memory device 510 via a data bus. The data bus is illustrated by the I/O components of the data bus, write data 554 (written from memory controller 530 to memory device 510) and read data 556 (read from memory device 510 to memory controller 530). The data bus represents a bus (group of signaling lines) over which data can be transferred in a series of I/O transactions between memory controller 530 and memory device 510. Command/address bus 552 represents a bus over which memory controller 530 provides memory device commands for memory device 510 to execute. The commands can be any command related to accessing data (e.g., read/write commands), accessing a data location (e.g., activate, refresh), accessing a register (e.g., setting/reading a Mode Register), or other commands.

In one embodiment, the data bus can be considered to include multiple channels or lanes. Each lane is a portion of the command bus (e.g., a byte). In one embodiment, the data to place on the data bus is generated in portions (e.g., 8 bits, 16 bits, or some other number of bits at a time), and then composed together for a single I/O transaction (e.g., 64 total bits). Each portion can be considered a lane.

Scheduler 532 can be similar to any scheduler discussed above, and schedules data traffic in accordance with an access or I/O protocol or requirements for interfacing with the memory device. In one embodiment, memory controller 530 includes write data buffer (WDB) 534 or comparable hardware to generate write data 554. In one embodiment, WDB 534 is an existing write data buffer of a system into which a test system is integrated, or some other existing structure used to queue up low priority write data. In one embodiment, WDB 534 is a different existing structure that has the capacity to store data entries and provide a test generator array of bits. In one embodiment, WDB 534 is a dedicated structure placed in the system to be used for test traffic generation. The implementation of WDB 534 is dependent on the system in which the test system will be integrated, and ease of implementation.

In one embodiment, the WDB is a fully functional structure that can be used to queue up one or more outstanding write commands when the memory system is otherwise occupied. In most systems, write operations are significantly lower priority that reads. Internal execution is often gated until read data is returned from memory. However, in most systems as long as the WDB is not full, writes do not gate any execution. Thus, writes are usually scheduled as low priority, opportunistic operations. Thus, use of the WDB to generate data stress traffic can be performed through reuse of a structure that already exists in a system's memory controller for other functional reasons.

The generation of write data 554 in normal operation includes signaling the write data signal to physical layer 520 in response to receiving the data to send as part of the memory access transaction. Typically the receiving of the memory access transaction and the signaling of the write data are spaced by a certain amount of time based on the operation of the memory controller and the load on the memory controller. Generally the write transaction is provided to the memory controller, which allocates an entry in the WDB for the data. At some time later, the memory controller schedules the write and sends the corresponding data to the physical layer. Memory controller 530 maps the transaction into appropriate commands, and the write data is generated in response to the data received in the transaction. Thus, traditionally WDB 534 is a simple buffer, receiving data which is then placed as scheduled onto the data bus.

As described herein, memory controller 530 includes test signal generation logic 539 to generate test data to place on the data bus. One example of an embodiment of generation logic 539 is described below with respect to FIGS. 7A and 7B. In one embodiment, logic 539 is part of WDB 534 or is logic provided to enable generation of test data traffic with WDB 534 as an array of bits or bit patterns. Via logic 539, write data buffer can create a variety of high stress patterns of write data 554 on the data bus.

In one embodiment, memory controller 530 receives a test transaction from mux 540, and uses logic 536 and WDB 534 to generate test traffic to implement the test transaction. The test transaction can come from test engine 570 (transaction 572). In one embodiment, the test transaction can come from memory address decoder 560 (transaction 562). WDB 534 and read return datapath 536 operate in accordance with scheduling from scheduler 532 to implement I/O operations associated with the test transaction. In one embodiment, test data is written to WDB 534 as part of a test setup of system 502, and test data transaction 572 simply sequences patterns out of WDB 534, but does not write or generate data within the WDB. Thus, generation of a test signal can be understood as provisioning or sequencing patterns of bits out of data in WDB 534. In one embodiment, creating row/column stripes or checkerboard patterns can include sequencing data out of the WDB and then modifying the data from the WDB (e.g., inverting certain bits), or reading data out that provides the desired patterns.

In one embodiment, WDB 534 is able to provide multiple different types of stress case patterns. Examples of stress cases can include pseudorandom patterns on all lanes, single frequency tone patterns to excite resonances, fixed patterns to support hardware training modes, and fixed patterns where software can control the values on every lane in every cycle independently to find worst case patterns via advanced search techniques. Additionally, in one embodiment, WDB 534 can provide stress case patterns related to victim and aggressor lane traffic. As used herein, an aggressor lane is a lane whose traffic pattern can cause interference (e.g., ISI, crosstalk) on another lane. The lane on which the interference appears can be referred to as the victim lane. WDB 534 can generate traffic to provide one traffic pattern one or more victim lanes while adjacent aggressor lanes get one or more different patterns, and in one embodiment can automatically rotate the victim lane. For example, WDB 534 can assign one lane to be a victim lane, three other lanes to driver aggressor pattern A, and four other lanes to drive aggressor pattern B. Thus, there is a considerable flexibility in how the signal patterns can be created and used in combination. Additionally, in one embodiment, WDB 534 can combine resonance patterns and pseudorandom patterns to simultaneously create supply noise and ISI/crosstalk.

Write data 554 is read out of an array of WDB 534 (e.g., via scheduler 532 or transmission logic) and sent to DDR physical layer 520 to be transmitted to memory device 510. As way of example and not limitation, suppose a single memory read/write command transmits a total of 512 bits (a cache line) that is spread over 64 lanes and 8 cycles. Instead of having a 512-bit wide buffer, in one embodiment, a cache line is read from WDB 534 and sent through a PISO (Parallel In Serial Out) to serialize the data before transmitting it to the memory device. Such an operation can be performed with selection logic that selects from 0 to 7 as part of a PISO operation. Such a structure is illustrated below with respect to FIG. 7A, and with minimal additional logic can be expanded to generate a wide variety of test patterns.

In one embodiment, any writing performed is tested by, at some later point, reading back the same data from the memory device and comparing it to expected data 558. Memory controller 530 can read back data 556 via read return datapath 536. The read data 556 can be compared to expected data 558 by error reader 538. In one embodiment, expected data 538 is read from WDB 534. In one embodiment, error reader 538 is part of WDB 534. In an alternate embodiment, error reader 538 is logic in memory controller 530 that is separate from WDB 534.

In one embodiment, the data is compared via XORing read data 556 with expected data 558. If a '1' bit is generated during the XOR, there is a data mismatch. If any bits mismatch, it indicates an error in the I/O or the memory device itself.

Figure 5B:
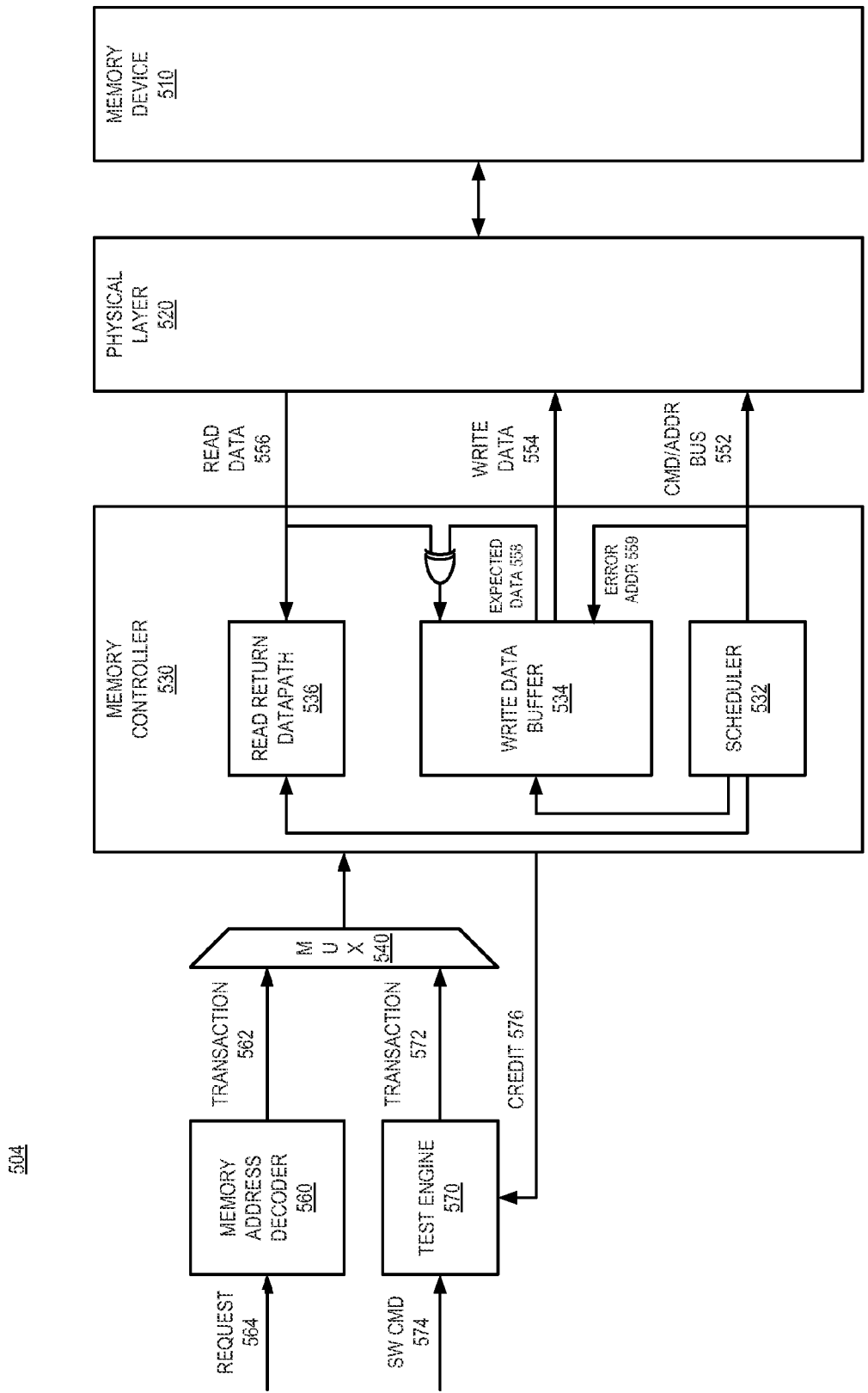
FIG. 5B is a block diagram of an embodiment of a system having a write data buffer coupled to the data bus to provide a signal pattern on the data bus and log errors.

FIG. 5B is a block diagram of an embodiment of a system having a write data buffer coupled to the data bus to provide a signal pattern on the data bus and log errors. System 504 is similar to system 502 of FIG. 5A, and any discussion of components with similar reference numerals applies to the components of system 504. In one embodiment, system 504 does not include error reader 538, but includes error logic in WDB 534. The descriptions with respect to system 504 could be applied to error reader 538 of system 502.

In one embodiment, write data 554 can be read back as read data 556 at some time after the writing is completed. The reading does not necessarily need to be performed directly after performing the write, because of the ability of WDB 534 to obtain address information and write information for written data. Read data 656 is obtained in response to an I/O command on command/address bus 652 to access the written data.

In one embodiment, memory controller 530 XORs expected data 558 with actual read data 556, and writes the result back into a spare entry of WDB 534 whenever an error occurs. In one embodiment, WDB 534 is statically or dynamically partitioned between storing test data and error results. In one embodiment, results are only written back when a data mismatch is detected. In one embodiment, the results are written back, but overwritten each time unless the results indicate a mismatch, in which case another entry can then be written to. Data errors can be logged as one or more of the following: received data, expected data, received data XOR expected data. In one embodiment, WDB 534 obtains error address information 559 to precisely locate which lane/cycle of the I/O failed or which memory cell failed. As with the data, the failing address could also be written back into a spare entry of WDB 534. The combination of XOR data and address information can precisely identify a failure. In one embodiment, memory controller 530 also records information such as an indication of how many transactions have occurred since the start of the test (before the error occurred), or a total number of errors, or a number of areas for a memory region. Such information could be used, for example, if a given test touches the same location in memory multiple times within a single test, to identify which transactions failed for a given address.

In one embodiment, memory controller 530 records actual read data 556 when an error is detected. In one embodiment, memory controller 530 records XOR data (the results of the XOR operation) when an error is detected. If the expected data is a known value that was programmed by the test, once either the actual or XOR data is known, the other can be calculated.

Recording information about what memory locations contain errors can enable memory test and repair strategies. Without recording the sufficient error information (e.g., not enough entries, or no address information, or no data information), it could be impossible to repair non-working memory cells. On the other hand, repairing bad cells can reduce memory cost (especially in cases where memory is soldered down to a motherboard) and reduce memory self refresh power.

For various testing and isolation purposes, the error checking logic can include hardware to mask or ignore errors that occur in certain cycles, certain address ranges, or on certain lanes. For example, some turnaround time tests fail with a signature of only the first cycle of a given command being corrupted. The error checking logic can also include hardware to generate a signal that stops the test execution. Examples may include stopping on the Nth error, stopping after all bytes have seen an error, or stopping after all lanes have seen an error.

Figure 6:
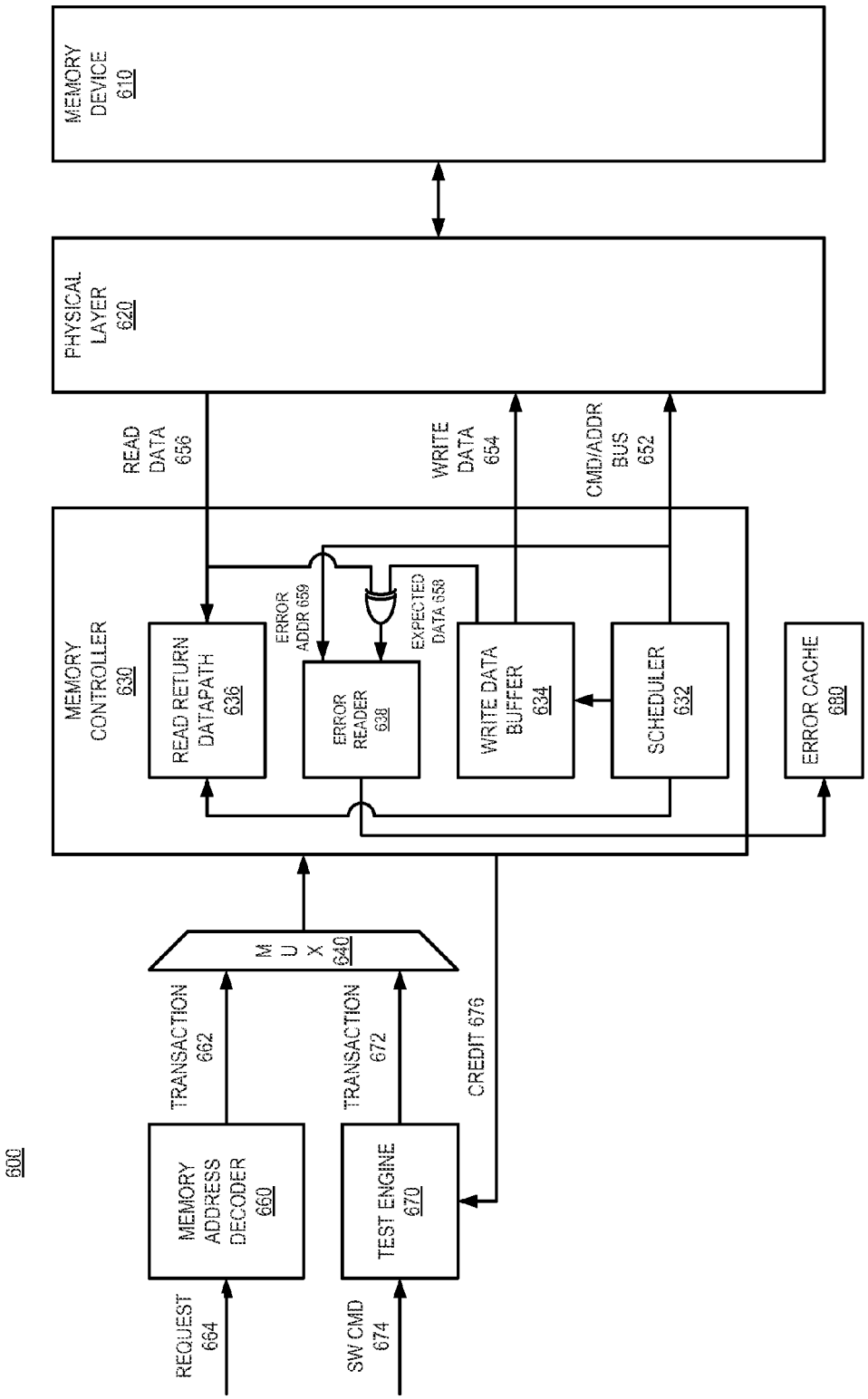
FIG. 6 is a block diagram of an embodiment of a system having a write data buffer coupled to the data bus to provide a signal pattern on the data bus and log errors in an external error cache.

FIG. 6 is a block diagram of an embodiment of a system having a write data buffer coupled to the data bus to provide a signal pattern on the data bus and log errors in an external error cache. System 600 represents one example of an embodiment of a system in accordance with systems 502 and 504 discussed above. Request 664, memory address decoder 660, transaction 662, software command 674, test engine 670, transaction 672, mux 640, memory controller 630, scheduler 632, command/address bus 652, WDB 634, write data 654, read return datapath 636, and read data 656 are similar to elements discussed above with respect to those systems, and the discussion there applies to these elements of system 600.

In one embodiment, error reader 638 is part of WDB 634. In an alternative embodiment, error reader 638 is an element of memory controller 630 that is separate from WDB 634. Error reader 638 receives actual read data 656 and expected data 658 to compare for mismatch. The data can be XORed together or otherwise compared. When a mismatch is detected, an error is logged. The logged error can include the actual read back data 656, the XOR result, and/or error address 659 (which can be obtained from scheduler 632).

In one embodiment, whether error reader 638 is part of WDB 634 or separate logic, error reader 638 stores error log information in error cache 680. In the discussion of systems 502 and 504, the WDB was described as storing the error information. It should be understood that for storing error log information WDB 634 can be used as a generic storage array, and the {data (e.g., XOR result), Address} data could be stored in various existing or dedicated storage arrays, represented by error cache 680. Error cache 680 could be separate from WDB 634, and could be separate from memory controller 630. Alternatively, error cache 680 could simply be separate from WDB 634, but still part of memory controller 630.

Thus, in one embodiment, system 600 uses an existing queue structure in memory controller 630, a cache, memory device 610, or other external storage structures to store error information. The choice of where to store the error information is an implementation specific detail selected based on how many entries are required, and convenience for the particular system. Regardless of where the information is stored, system 600 stores sufficient information to precisely describe failures. When sufficient hardware space can be allocated to recording error information, every failure can be identified in detail.

As described in systems 502, 504, and 600, the systems can record the results of errors for multiple failures without needing to stop/restart the memory test after every failure. Thus, as described herein, the memory testing can maintain high test bandwidth while recording the failures during the test. Such an approach can reduce test time and cost.

Figure 7B:
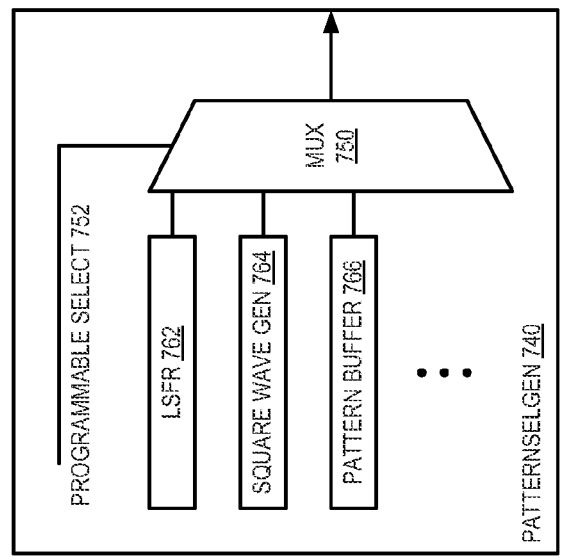
FIG. 7B is a block diagram of an embodiment of programmable pattern selection generator.
Figure 7A:
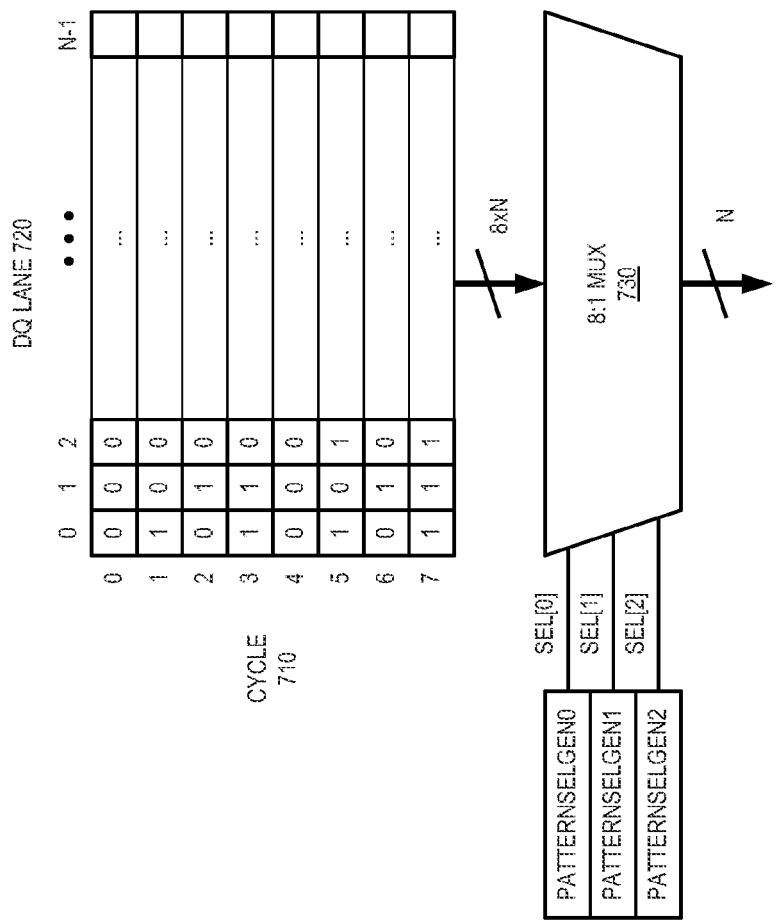
FIG. 7A is a block diagram of an embodiment of a test signal generator including a bit array selectable by pattern generators.

FIG. 7A is a block diagram of an embodiment of a test signal generator including a bit array selectable by pattern generators. The signal generator provides one example embodiment of a generator in accordance with any embodiment described herein, and can be used with any WDB or comparable structure described herein. The generator includes a bit array of M×N bits, where M=8 in the drawing. In one embodiment, the bit array includes 32 cachelines, which assuming a burst length of 8, would mean M=8*32=256. Other values of M are possible. N is a width that provides a desired amount of storage. In one embodiment, N is a width of the data bus. As one example, N=64. Other values of N are possible. In general, it will be understood that there are numerous ways to generate write data for a memory device. The significant part is not necessarily the amount of storage space, which can be designed and/or configured based on implementation, but rather the fact that there is storage space that can be used to generate data patterns.

As illustrated, the bit array has rows representing cycle 710, or cycles of bit generation, and columns representing data lanes 720. As discussed previously, the lanes could be wider than a single bit. It will be understood that to select which cycle 710 to use, mux 730 should be triggered with a number Y of select lines where 2^Y is greater than or equal to M. Thus, three PatternSelGen blocks are shown, PatternSelGen0, PatternSelGen1, and PatternSelGen2. It will be understood that the three different PatternSelGen blocks represent different pattern selection logic. In one embodiment, the different pattern selection logic is used to produce combinations of different types of pattern logic, which produces different combinations of bits in the array. The different logic type is explained in more detail below with respect to FIG. 7B. The selection logic, PatternSelGen produces SEL[2:0] to control mux 730. Mux 730 is one embodiment of a parallel to serial mux (PISO). It will be understood that there can be other, separate PISO paths in a practical system, such as one on a command bus.

As seen, the bit array includes a simple binary sequence for columns 0-2, starting with 000 in row0, and ending with 111 in row7. Other bit array values are possible. There could also be any number of bits sequence patterns in the other columns of the bit array. The bit array structure could be used with no changes to the bits in the rows to provide M fully programmable data patterns. For example, the programmability capability could be used by training algorithms to generate fixed patterns (e.g., MPR 1010 pattern for DDR3 DIMM). In one embodiment, the bit array is used by search algorithms to attempt to find the worst case pattern by adjusting individual bits.

By adding PatternSelGen logic to Sel[2:0], the signal generation logic can operate as a lookup or truth table the encodes a specific Boolean combination of the Sel[2:0] inputs. For example, as shown in the binary sequence of columns 0-2, DQ [0] data is programmed to be 1 whenever Sel[0] is 1. Thus, DQ [0] is programmed to always output Sel[0]. Similarly, DQ[1]=Sel[1], and DQ[2]=(Sel[0]&Sel[2]). In general, such a lookup table approach allows any columns/lanes to be programmed to generate any Boolean combination of {Sel[0], Sel[1], Sel[2]}. Thus, a single PatternSelGen block can be shared by all the columns/lanes and be assigned to any given column/lane with almost no overhead logic.

FIG. 7B is a block diagram of an embodiment of programmable pattern selection generator. PatternSelGen 740 is one example embodiment of PatterSelGen logic such as used in FIG. 7A. In one embodiment, each PatternSelGen block (e.g., 0, 1, 2) is implemented as PatternSelGen 740, with multiple different logic options for each one. In an alternative embodiment, PatternSelGen 740 is implemented in a more collective fashion rather than having all logic types repeated for each PatternSelGen. For example, PatternSelGen0, PatternSelGen1, and PatternSelGen2 could be three separate muxes 750, which each have a programmable select signal 752, and all three (or other number) multiplexers are connected to the same logic blocks. In another alternative embodiment, the output of mux 750 could be fed into multiple different logic buffers, and multiple different iterations of pattern selection can be made to generate the select signal (e.g., SEL[2:0]).

PatternSelGen 740 can have multiple different pattern options built into it, depending on the implementation of the test system. Three possible examples are illustrated: LSFR (linear shift feedback register) 762, square wave generator 764, and pattern buffer 766. Other types are possible.

LSFR 762 can generate a pseudorandom pattern with minimal hardware cost. LFSR 762 can use either a fixed or programmable polynomial, depending on implementation. In one embodiment, LFSR 762 has a fixed starting seed, and in another embodiment, LFSR 762 has a programmable starting seed. The programmable aspects can be programmed by the memory controller, or by a test system administrator system. In one embodiment, LSFR 762 is implemented on the same hardware as pattern buffer 766.

Square wave generator 764 can be a FSM (finite state machine) that will generate a digital square wave (e.g., X ones followed by Y zeros) with programmable frequency, phase shift, and duty cycle. The programmable aspects can be programmed by the memory controller, or by a test system administrator system. Given that square wave generator 764 can generate a single tone frequency, can be useful at exciting resonance frequencies in the I/O system of the memory subsystem. In one embodiment, a specific resonance frequency is not known precisely. In such a case, square wave generator 764 can be programmed to increment through a range of frequencies (e.g., $f_{START}$ to $f_{STOP}$) and generate a chirp pattern. The chirp can generate a given frequency for a programmable length of time before incrementing to the next value, where the increment could be done in either a linear or exponential fashion. In one embodiment, the test system uses a square wave generator with chirp as a source of traffic.

In one embodiment, pattern buffer 766 can be a rotating shift register programmed with a fixed X-bit long pattern. Thus, the logic buffer can apply a fixed pattern to some lanes without the overhead of needing to program the entire logic buffer or CADB. In a simple case, a programmable shift register can be programmed to walk linearly through all test values.

Figure 8:
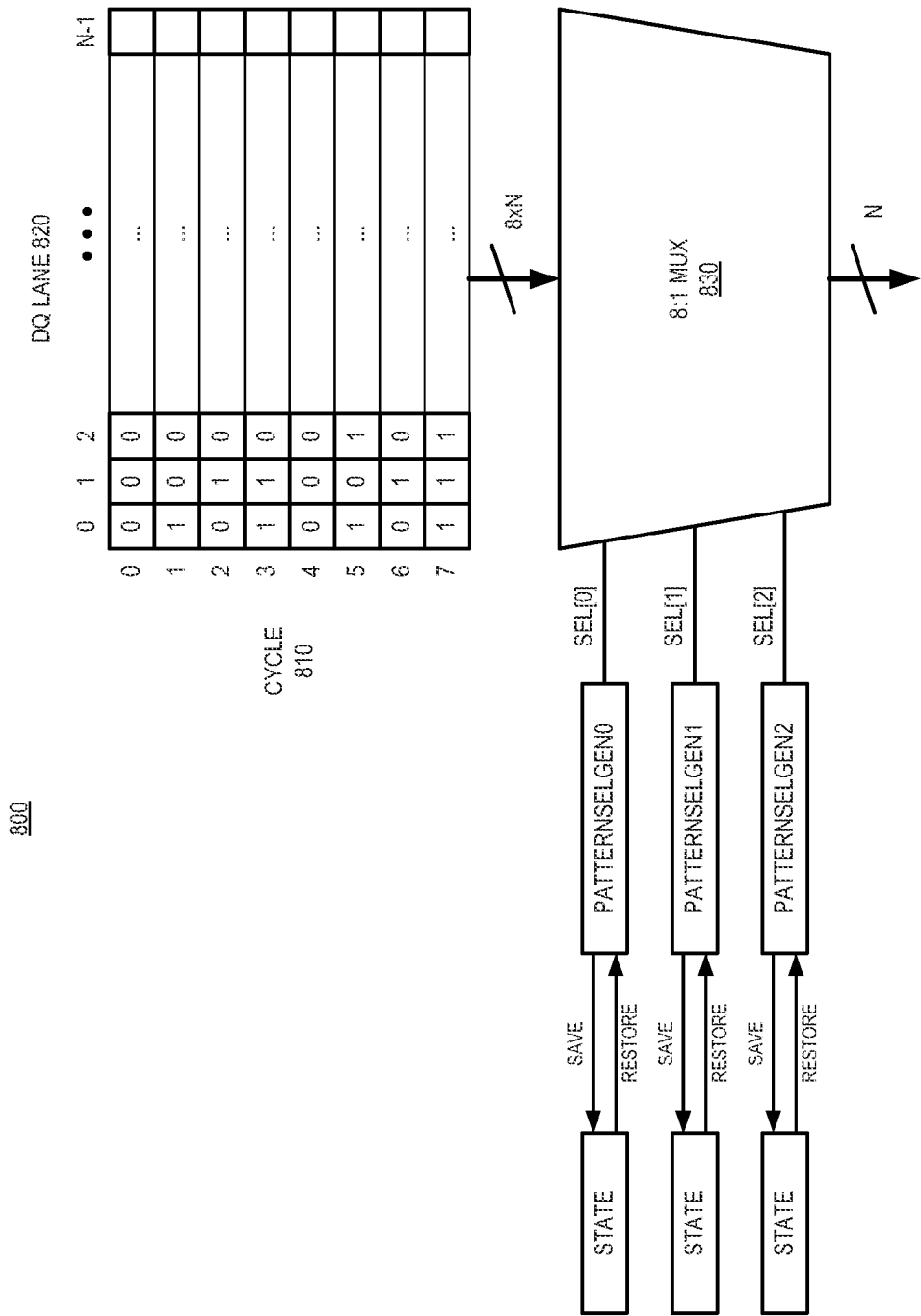
FIG. 8 is a block diagram of an embodiment of a test signal generator including a bit array selectable by pattern generators, where the pattern generators save and restore state.

FIG. 8 is a block diagram of an embodiment of a test signal generator including a bit array selectable by pattern generators, where the pattern generators save and restore state. Logic 800 is one example of a signal generator or signal generator logic in accordance with any embodiment described herein. Similar to what is shown in FIGS. 7A and 7B, logic 800 includes a bit array with rows, cycle 810, and with columns, DQ lane 820. Thus, as illustrated logic buffer 800 includes 8 rows and N columns, but there could be any number of rows needed to implement whatever testing is designed. 8:1 mux 830 (which could alternatively be labeled as an M:1 mux), selects one of the cycles or logical combinations of cycles 810 and outputs it, making an N-bit output to inject onto a data bus as write data.

Many classes of interesting patterns define a victim bit and a group of aggressor bits. As one possible example, suppose a test had eight data lanes, and used LFSR0 for DQ[0] (victim) and LFSR1 for DQ[7:1] (aggressors). Such a test could be iterated eight times, allowing each lane a chance to be a victim to achieve complete coverage. As illustrated, logic 800 includes eight cachelines of storage, and each victim-aggressor combination could use a single cacheline. Iteration of the test could be achieved by either starting/stopping the test to reprogram logic 800, or increasing the size of the logic buffer. It will be understood that in general, logic 800 could have a number of entries equal to (Number of Victim Lanes)* (2^Number of Sel). With a large enough bit array, the test could simply define a starting and stopping location within the blocks and how fast it should increment from one block to the next, where one block is (2^Number of Sel), and represents a single complete victim pattern.

In one embodiment, a test seeks to have each lane replay the same pattern sequence multiple times during a test, for example, to achieve uniform coverage of the test. For example, continuing the same example from above, the test could have LFSR0 and LFSR1 start with the same initial seed for each victim lane. In one embodiment, logic buffer 800 periodically saves and restores the PatternSelGen state to be able to replay the same pattern sequence multiple times. PatternSelGen state could include, among other things, LFSR seed value, Pattern Buffer value, and/or Square Wave Generator counter values. Thus, the PatternSelGen could have two copies of its state, both initial and current. The current state is the working copy and can be incremented, for example, during the individual transactions. In one embodiment, the initial copy is only updated by software before the test starts or during a save operation. In one embodiment, restore overrides the current state with the initial state. Likewise, a save operation can override the initial state with the current state.

Referring more specifically to logic buffer 800, the selection logic is expanded and more complex than what is shown above in FIG. 7A. In one embodiment, each select line (SEL [2:0]) is selected from multiple potential patterns, for example, by a multiplexer. A simpler case is illustrated for simplicity in illustration. As illustrated, each block, PatternSelGen0, PatternSelGen1, and PatternSelGen2, can save and restore state to reuse a pattern selection multiple times. A save operation stores a current state of the PatternSelGen block into an associated state storage. A restore operation reads the saved state out of the associated state storage to be applied within the PatternSelGen block. The determination to save and/or restore can be triggered in logic by test control logic, either from a memory controller, a test engine, or a remote administration source.

In one embodiment, a WDB including logic 800 can generate both write data and expected read data. Since writes and read will occur at different times, PatternSelGen blocks should be independent between the read and write operations. Such independence allows the write PatternSelGen block to walk through a fixed sequence of traffic (e.g., LFSR increments, Pattern buffer rotations, or others), and its state is only incremented when there is write data. When a read operation is happening, logic 800 can switch to a separate PatternSelGen block that has the same initial condition as write, and can thus replay the same pattern sequence. Such operation can ensure the expected read data will match the write data as long as the number and order of write/read transactions matches, which can be met by making such a constraint on operation of logic 800, either through configuration or runtime programming. One option is to have separate PatternSelGen blocks for read and write. Alternatively, the PatternSelGen blocks can be shared with independent states for read or write transactions. As another alternative, the save/restore flow could be used to provide independent write versus read storage.

Returning to the example above, in one embodiment, the PatternSelGen logic is configured for a particular test or test sequence to restore state every time the cacheline increments. In one embodiment, when logic 800 wraps back to the starting cacheline, the PatternSelGen block can skip the restore operation and replace it with a save operation. Thus, logic 800 could perform a long test that walks through the cachelines multiple times while still making forward progress through the possible test patterns (e.g., LFSR patterns) while providing identical stress on all victim lanes.

Figure 9:
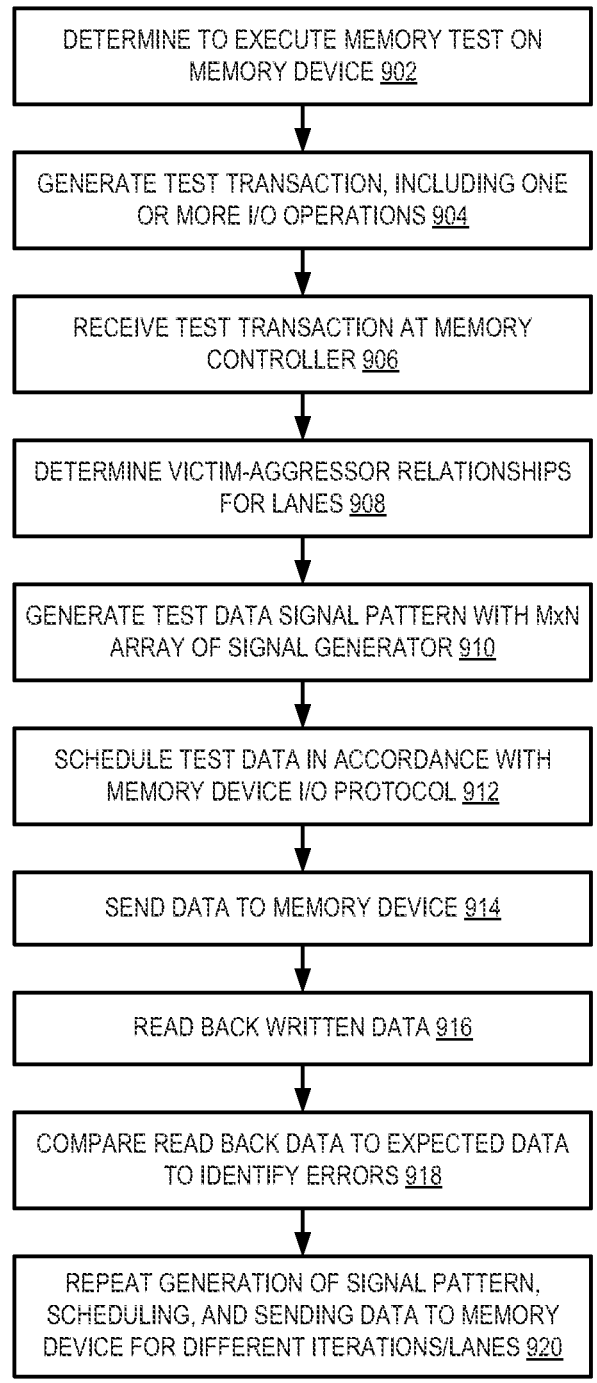
FIG. 9 is a flow diagram of an embodiment of a process for testing a data bus of a memory device, including generating a test signal.

FIG. 9 is a flow diagram of an embodiment of a process for testing a data bus of a memory device, including generating a test signal. In one embodiment, a test source determines to perform a memory test on a memory device, 902. There can be various reasons to perform a test, and various different types of test that can be performed. In one embodiment, the test includes injecting test signals onto a data bus. The test source generates a test transaction, including one or more I/O operations for the memory device to perform to determine its behavior, 904.

A memory controller coupled to the memory device receives the test transaction, 906. In one embodiment, the memory controller uses a write data buffer with signal pattern generation logic to generate the data to implement the test transaction. In one embodiment, the signal generation logic determines what victim-aggressor relationships exist for the lanes of the data bus, 908. It will be understood that not every test will utilize victim-aggressor relationships, and that such relationship could be determined only in cases where they will be used.

The memory controller, via the signal generation logic, generates a test data signal pattern, 910. In one embodiment, signal generation logic includes an M×N array of bits to generate the signal pattern. The signal generator can generate one of multiple different signal pattern types to produce the ultimate signal pattern. The scheduler of the memory controller directs the output of the generated test data. Thus, the memory controller can schedule the test data in accordance with memory device I/O protocol, 912. The memory controller sends the test data to the memory device, 914.

In one embodiment, the memory controller reads back the written test data, 916. The read back does not necessarily need to be in the subsequent command from the write (e.g., WR, ACT, RD), but multiple writes or other I/O operations could occur prior to read back. The memory controller includes logic that compares the read back data to expected data to identify errors in the write and/or read operations, 918, which is described in more detail below with respect to FIG. 10. In one embodiment, a WDB generates the test data to write, and also generates the expected data. In one embodiment, the comparison logic is part of the WDB. The memory controller can repeat the generation of the signal pattern, scheduling, and sending the data to the memory device for different lanes, and/or for different iterations of the test, 920.

Figure 10:
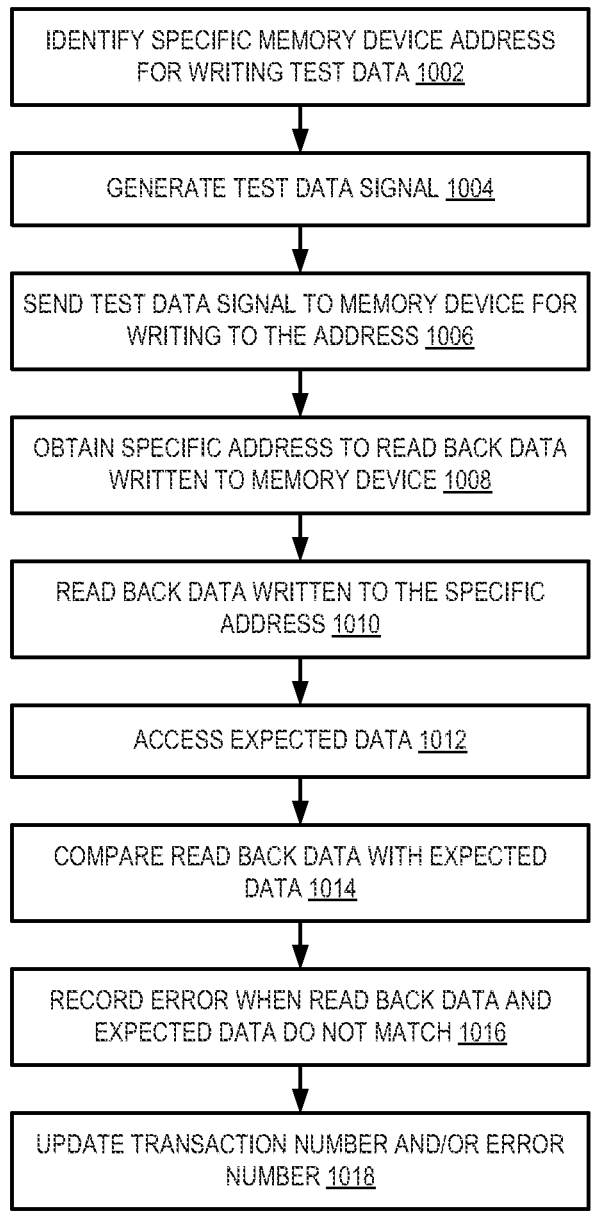
FIG. 10 is a flow diagram of an embodiment of a process for testing a data bus of a memory device, including reading back test data.

FIG. 10 is a flow diagram of an embodiment of a process for testing a data bus of a memory device, including reading back test data. In one embodiment, during performance of a test transaction, a memory controller identifies a specific memory address for writing test data, 1002. In one embodiment, the test system generates a test data signal, 1004, which can be in accordance with any embodiment described herein, such as described with respect to FIG. 9. However, for purposes of reading back data and recording errors, the mechanism used to generate the test data may not be relevant as long as the test system can generate expected data.

The memory controller sends a test data signal to the memory device for writing to the identified address, 1006. The memory controller can then obtain the specific address at error testing logic and read back the data written to the memory device, 1008. Again, the data need not be immediately (e.g., as the next I/O operation) read back after being written, although it could be. The memory controller reads back the data written to the specific address, 1010, and provides the data to the error test logic. The error testing logic also obtains expected data, 1012, which could be stored in a cache or generated by a WDB, for example.

The error test logic compares the read back data to the expected data to determine if they match, 1014. In one embodiment, the comparison includes performing an XOR with the two data elements as input. The error test logic of the memory controller records an error when the read back data and the expected data do not match, 1016. In one embodiment, recording the error includes storing the data as well as the address of the error. The data itself could be stored without an address. The data can be stored as actual data or as the result of an XOR of the expected and actual data. In one embodiment, the error test logic updates a transaction number and/or number of errors, and/or other information that can be used to specifically identify the error.

In one embodiment, the error checking logic can mask errors from specific cycles, addresses, and/or data lanes. Thus, the error checking logic may record or log an error in one cycle or lane or address, and not another, based on the mask or filter of errors. Thus, the system can selectively log errors. In one embodiment, the error test logic can stop test execution after a certain number of errors have been detected, and/or after all entities (e.g., channels, lanes, bytes, ranks, or others) have flagged an error.

Figure 11:
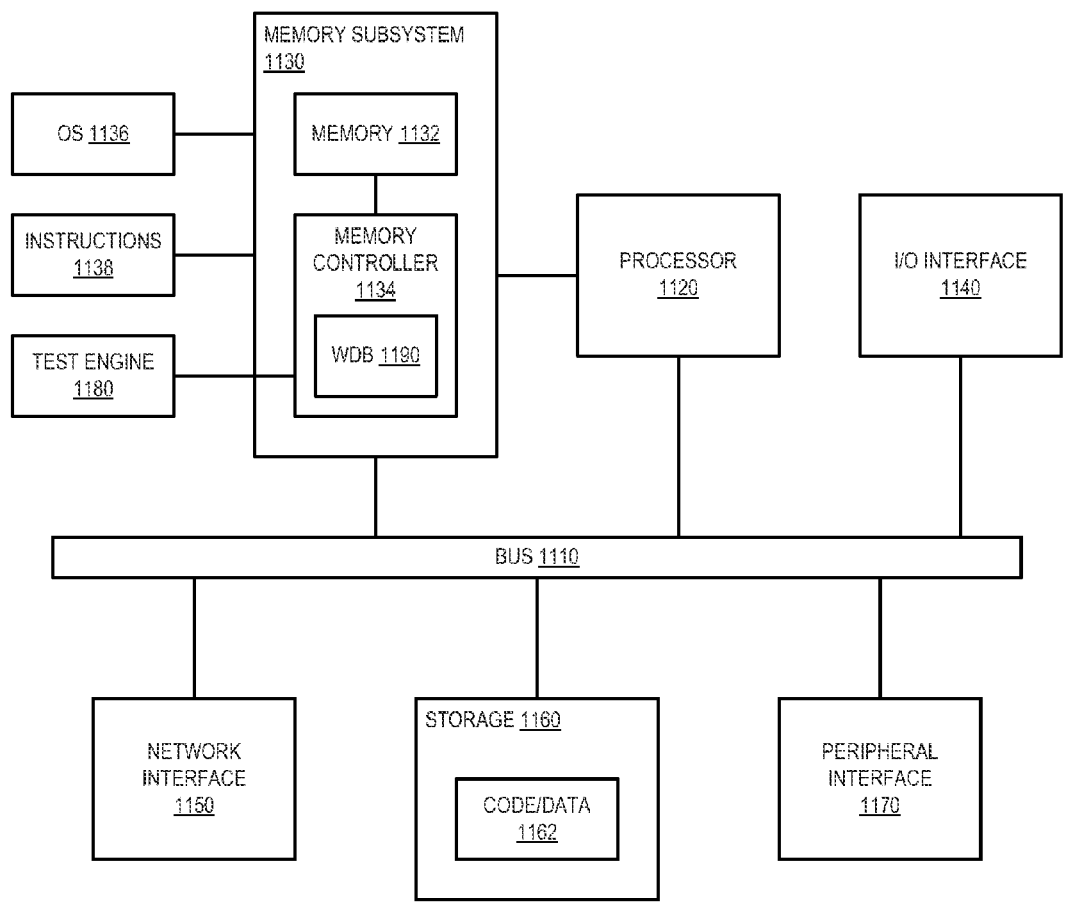
FIG. 11 is a block diagram of an embodiment of a computing system in which data bus testing can be implemented.

FIG. 11 is a block diagram of an embodiment of a computing system in which data bus testing can be implemented. System 1100 represents a computing device in accordance with any embodiment described herein, and can be a laptop computer, a desktop computer, a server, a gaming or entertainment control system, a scanner, copier, printer, routing or switching device, or other electronic device. System 1100 includes processor 1120, which provides processing, operation management, and execution of instructions for system 1100. Processor 1120 can include any type of microprocessor, central processing unit (CPU), processing core, or other processing hardware to provide processing for system 1100. Processor 1120 controls the overall operation of system 1100, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 1130 represents the main memory of system 1100, and provides temporary storage for code to be executed by processor 1120, or data values to be used in executing a routine. Memory subsystem 1130 can include one or more memory devices such as read-only memory (ROM), flash memory, one or more varieties of random access memory (RAM), or other memory devices, or a combination of such devices. Memory subsystem 1130 stores and hosts, among other things, operating system (OS) 1136 to provide a software platform for execution of instructions in system 1100. Additionally, other instructions 1138 are stored and executed from memory subsystem 1130 to provide the logic and the processing of system 1100. OS 1136 and instructions 1138 are executed by processor 1120.

Memory subsystem 1130 includes memory device 1132 where it stores data, instructions, programs, or other items. In one embodiment, memory subsystem includes memory controller 1134, which is a memory controller in accordance with any embodiment described herein, and which includes a scheduler to generate and issue commands to memory device 1132.

In one embodiment, system 1100 includes test engine 1180, which provides memory test transactions to memory controller 1134 to have memory controller 1134 schedule the transactions in order to provide deterministic testing. Thus, test engine 1180 enables transaction-level memory testing of memory 1132 in accordance with any embodiment described herein. In one embodiment, memory controller 1134 includes WDB 1190, which represents test signal generation logic for system 1100. WDB 1190 includes logic that can generate a test signal based on a variety of different signal patterns. The test signal can be sent to the memory device on a data bus, in accordance with any embodiment described herein.

Processor 1120 and memory subsystem 1130 are coupled to bus/bus system 1110. Bus 1110 is an abstraction that represents any one or more separate physical buses, communication lines/interfaces, and/or point-to-point connections, connected by appropriate bridges, adapters, and/or controllers. Therefore, bus 1110 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 1110 can also correspond to interfaces in network interface 1150.

System 1100 also includes one or more input/output (I/O) interface(s) 1140, network interface 1150, one or more internal mass storage device(s) 1160, and peripheral interface 1170 coupled to bus 1110. I/O interface 1140 can include one or more interface components through which a user interacts with system 1100 (e.g., video, audio, and/or alphanumeric interfacing). Network interface 1150 provides system 1100 the ability to communicate with remote devices (e.g., servers, other computing devices) over one or more networks. Network interface 1150 can include an Ethernet adapter, wireless interconnection components, USB (universal serial bus), or other wired or wireless standards-based or proprietary interfaces.

Storage 1160 can be or include any conventional medium for storing large amounts of data in a nonvolatile manner, such as one or more magnetic, solid state, or optical based disks, or a combination. Storage 1160 holds code or instructions and data 1162 in a persistent state (i.e., the value is retained despite interruption of power to system 1100). Storage 1160 can be generically considered to be a "memory," although memory 1130 is the executing or operating memory to provide instructions to processor 1120. Whereas storage 1160 is nonvolatile, memory 1130 can include volatile memory (i.e., the value or state of the data is indeterminate if power is interrupted to system 1100).

Peripheral interface 1170 can include any hardware interface not specifically mentioned above. Peripherals refer generally to devices that connect dependently to system 1100. A dependent connection is one where system 1100 provides the software and/or hardware platform on which operation executes, and with which a user interacts.

Figure 12:
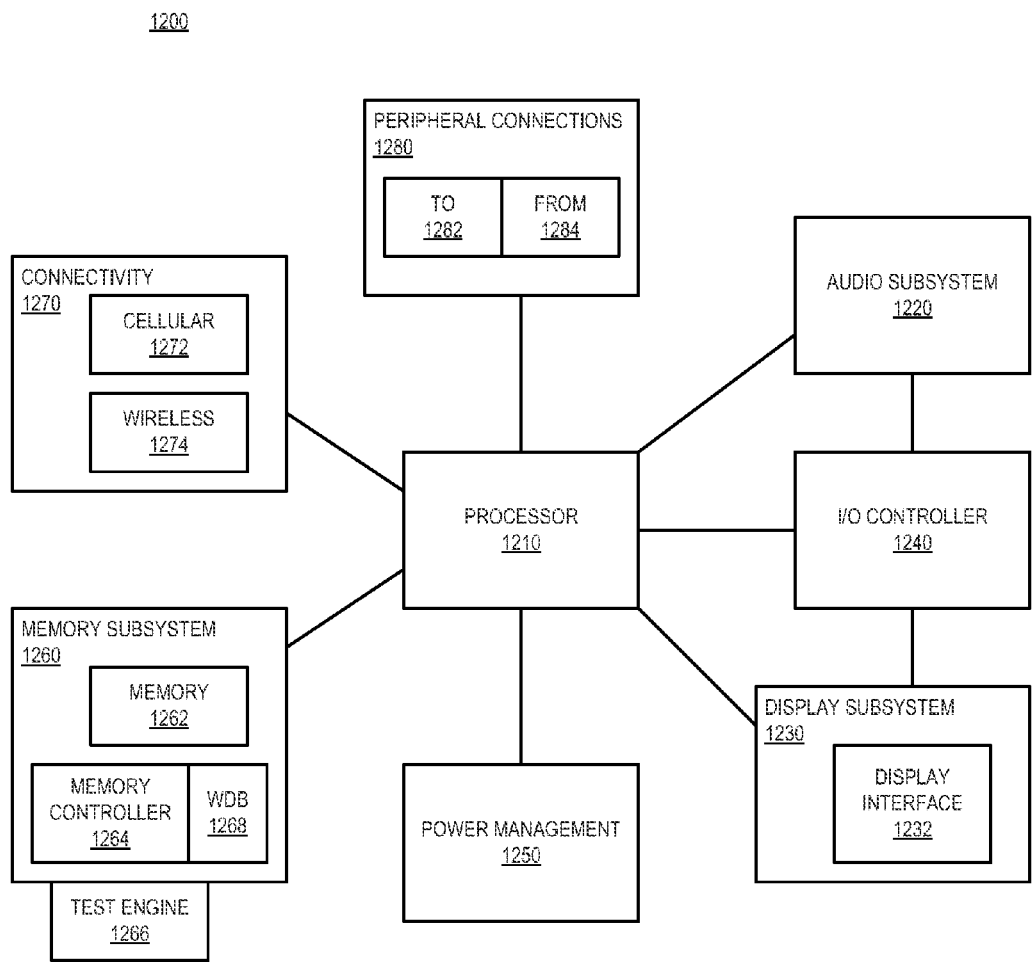
FIG. 12 is a block diagram of an embodiment of a mobile device in which data bus testing can be implemented.

FIG. 12 is a block diagram of an embodiment of a mobile device in which data bus testing can be implemented. Device 1200 represents a mobile computing device, such as a computing tablet, a mobile phone or smartphone, a wireless-enabled e-reader, or other mobile device. It will be understood that certain of the components are shown generally, and not all components of such a device are shown in device 1200.

Device 1200 includes processor 1210, which performs the primary processing operations of device 1200. Processor 1210 can include one or more physical devices, such as microprocessors, application processors, microcontrollers, programmable logic devices, or other processing means. In one embodiment, processor 1210 includes optical interface components in addition to a processor die. Thus, the processor die and photonic components are in the same package. Such a processor package can interface optically with an optical connector in accordance with any embodiment described herein.

The processing operations performed by processor 1210 include the execution of an operating platform or operating system on which applications and/or device functions are executed. The processing operations include operations related to I/O (input/output) with a human user or with other devices, operations related to power management, and/or operations related to connecting device 1200 to another device. The processing operations can also include operations related to audio I/O and/or display I/O.

In one embodiment, device 1200 includes audio subsystem 1220, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1200, or connected to device 1200. In one embodiment, a user interacts with device 1200 by providing audio commands that are received and processed by processor 1210.

Display subsystem 1230 represents hardware (e.g., display devices) and software (e.g., drivers) components that provide a visual and/or tactile display for a user to interact with the computing device. Display subsystem 1230 includes display interface 1232, which includes the particular screen or hardware device used to provide a display to a user. In one embodiment, display interface 1232 includes logic separate from processor 1210 to perform at least some processing related to the display. In one embodiment, display subsystem 1230 includes a touchscreen device that provides both output and input to a user.

I/O controller 1240 represents hardware devices and software components related to interaction with a user. I/O controller 1240 can operate to manage hardware that is part of audio subsystem 1220 and/or display subsystem 1230. Additionally, I/O controller 1240 illustrates a connection point for additional devices that connect to device 1200 through which a user might interact with the system. For example, devices that can be attached to device 1200 might include microphone devices, speaker or stereo systems, video systems or other display device, keyboard or keypad devices, or other I/O devices for use with specific applications such as card readers or other devices.

As mentioned above, I/O controller 1240 can interact with audio subsystem 1220 and/or display subsystem 1230. For example, input through a microphone or other audio device can provide input or commands for one or more applications or functions of device 1200. Additionally, audio output can be provided instead of or in addition to display output. In another example, if display subsystem includes a touchscreen, the display device also acts as an input device, which can be at least partially managed by I/O controller 1240. There can also be additional buttons or switches on device 1200 to provide I/O functions managed by I/O controller 1240.

In one embodiment, I/O controller 1240 manages devices such as accelerometers, cameras, light sensors or other environmental sensors, gyroscopes, global positioning system (GPS), or other hardware that can be included in device 1200. The input can be part of direct user interaction, as well as providing environmental input to the system to influence its operations (such as filtering for noise, adjusting displays for brightness detection, applying a flash for a camera, or other features).

In one embodiment, device 1200 includes power management 1250 that manages battery power usage, charging of the battery, and features related to power saving operation. Memory subsystem 1260 includes memory device(s) 1262 for storing information in device 1200. Memory subsystem 1260 can include nonvolatile (state does not change if power to the memory device is interrupted) and/or volatile (state is indeterminate if power to the memory device is interrupted) memory devices. Memory 1260 can store application data, user data, music, photos, documents, or other data, as well as system data (whether long-term or temporary) related to the execution of the applications and functions of system 1200.

In one embodiment, memory subsystem 1260 includes memory controller 1264 (which could also be considered part of the control of system 1200, and could potentially be considered part of processor 1210). Memory controller 1264 includes a scheduler to generate and issue commands to memory device 1262. In one embodiment, test engine 1266 is coupled to or part of memory subsystem 1260, and provides memory test transactions to memory controller 1264. The test transactions can cause memory controller 1264 to schedule the transactions to provide deterministic testing of memory device 1262. Test engine 1266 enables transaction-level memory testing in memory subsystem 1260 in accordance with any embodiment described herein. In one embodiment, memory subsystem 1260 includes WDB 1268, which represents test signal generation logic in accordance with any embodiment described herein. WDB 1268 includes logic that can generate a test signal based on a variety of different signal patterns. The test signal can be sent to the memory device on a data bus, in accordance with any embodiment described herein.

Connectivity 1270 includes hardware devices (e.g., wireless and/or wired connectors and communication hardware) and software components (e.g., drivers, protocol stacks) to enable device 1200 to communicate with external devices. The device could be separate devices, such as other computing devices, wireless access points or base stations, as well as peripherals such as headsets, printers, or other devices.

Connectivity 1270 can include multiple different types of connectivity. To generalize, device 1200 is illustrated with cellular connectivity 1272 and wireless connectivity 1274. Cellular connectivity 1272 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1274 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 1280 include hardware interfaces and connectors, as well as software components (e.g., drivers, protocol stacks) to make peripheral connections. It will be understood that device 1200 could both be a peripheral device ("to" 1282) to other computing devices, as well as have peripheral devices ("from" 1284) connected to it. Device 1200 commonly has a "docking" connector to connect to other computing devices for purposes such as managing (e.g., downloading and/or uploading, changing, synchronizing) content on device 1200. Additionally, a docking connector can allow device 1200 to connect to certain peripherals that allow device 1200 to control content output, for example, to audiovisual or other systems.

In addition to a proprietary docking connector or other proprietary connection hardware, device 1200 can make peripheral connections 1280 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one aspect, a memory subsystem includes a memory device to store data and execute memory device commands to access and manage the data; a memory controller coupled to the memory device via a data bus, to receive a test transaction, the test transaction indicating one or more memory I/O (input/output) operations to perform a test on a memory device coupled to the memory controller; a test signal generator of the memory controller to generate a test data signal pattern in response to the memory controller receiving the test data transaction, the test signal generator including multiple different pattern signal generators to generate different types of signal patterns; and a scheduler of the memory controller to schedule the test data signal pattern in accordance with a memory device I/O protocol, and sending the test data signal pattern to the memory device to cause the memory device to execute an I/O operation to implement a portion of the test transaction.

In one embodiment, the memory controller is to receive the test transaction from a test engine coupled to the memory controller in parallel to a memory access request path used by a host processor. In one embodiment, the memory controller further comprises a write data buffer, and the write data buffer includes test signal generator logic. In one embodiment, the write data buffer is used to buffer write data transactions for standard memory access transactions, and is further used to generate the test data signal pattern for the test transaction.

In one embodiment, the test signal generator is to generate the signal pattern by selecting bits of an M×N buffer array of bits. In one embodiment, the test signal generator is to generate a Boolean combination of bits of the buffer array, where bits are associated with different pattern types. In one embodiment, N is a number of bits equal to a width of the data bus. In one embodiment, M is a burst length. In one embodiment, M is a total number of rows or cachelines in the buffer array.

In one embodiment, the test signal generator is to generate a worst case signal pattern based on victim-aggressor relationships of lanes of the data bus, where the worst case signal pattern is provided on an aggressor lane. In one embodiment, the test signal generator is to repeat generating the worst case signal pattern multiple times, each repetition switching which lane is the aggressor lane. In one embodiment, the multiple pattern signal generators are selected from a linear shift feedback register (LSFR), a square wave generator, a frequency generator, or a pattern buffer. In one embodiment, the multiple pattern signal generators further include associated storage to save and restore pattern signal generation state. In one embodiment, the test signal generator includes pattern signal generator logic for read operations that is separate from test signal generator logic for write operations. In one embodiment, the memory controller is to further read back data written to the memory device, compare the read back data to expected data, and generate an error when the read back data and the expected data do not match.

In one aspect, a method includes receiving a test transaction at a memory controller, the test transaction indicating one or more memory I/O (input/output) operations to perform a test on a memory device coupled to the memory controller; in response to receiving the test data transaction, generating with a test signal generator of the memory controller, a test data signal pattern, including selecting from multiple different pattern signal generators of the test signal generator that generate different types of signal patterns; scheduling the test data signal pattern with a scheduler of the memory controller in accordance with a memory device I/O protocol; and sending the test data signal pattern to the memory device to cause the memory device to execute an I/O operation to implement a portion of the test transaction.

In one embodiment, the memory controller includes a write data buffer, and generating the test data signal pattern comprises generating the test data signal pattern with logic of the write data buffer. In one embodiment, generating the test data signal pattern comprises generating a worst case signal pattern based on victim-aggressor relationships of lanes of the data bus, where the worst case signal pattern is provided on an aggressor lane. In one embodiment, the method further includes reading back data written to the memory device;

comparing the read back data to expected data; and generating an error when the read back data and the expected data do not match.

In one aspect, an electronic device comprising: a memory subsystem including a memory device to store data and execute memory device commands to access and manage the data; a memory controller coupled to the memory device to receive a test transaction, the test transaction indicating one or more memory I/O (input/output) operations to perform a test on a memory device coupled to the memory controller; a test signal generator of the memory controller to generate a test data signal pattern in response to the memory controller receiving the test data transaction, the test signal generator including multiple different pattern signal generators to generate different types of signal patterns; and a scheduler of the memory controller to schedule the test data signal pattern in accordance with a memory device I/O protocol, and sending the test data signal pattern to the memory device to cause the memory device to execute an I/O operation to implement a portion of the test transaction; and a touchscreen display coupled to generate a display based on data stored in the memory subsystem.

In one embodiment, the memory controller further comprises a write data buffer, and the test signal generator comprises logic of the write data buffer. In one embodiment, the test signal generator generate the signal pattern by selecting bits of an M×N buffer array of bits, wherein N is a number of bits equal to a width of the data bus.

In one aspect, a memory subsystem comprising: a memory device to store data and execute memory device commands to access and manage the data; and a memory controller coupled to the memory device to read back test data written to a specific memory address during a memory test of the memory device, the test data read back via an access command identifying the specific memory address, compare the read back data to expected data, and record an error with the specific memory address when the read back data does not match the expected data.

In one embodiment, the memory controller is to store the actual read back data with the specific memory address when the read back data does not match the expected data. In one embodiment, the memory controller is to store a result of an XOR operation between the read back data and the expected data with the specific memory address. In one embodiment, the memory controller is to store a number of transactions in a test sequence when the read back data does not match the expected data. In one embodiment, the memory controller is to store a number of failures at a region including the specific memory address. In one embodiment, the memory controller is to mask errors by cycle, address, or lane, and record only selected errors. In one embodiment, the memory controller is to stop a test based on a number of errors or a location of an error. In one embodiment, the memory controller includes a write data buffer, and the memory controller is to record the error and the specific address in the write data buffer. In one embodiment, the memory controller is to record the error and the specific address in a cache external to the memory controller.

Flow diagrams as illustrated herein provide examples of sequences of various process actions. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. An apparatus, comprising:
   a memory controller having a bus interface to couple to a memory device, the memory controller having an input to receive a test transaction, the test transaction indicating one or more memory I/O (input/output) operations to perform a test on the memory device;
   a test signal generator of the memory controller to generate a test data signal pattern in response to the memory controller receiving the test data transaction, the test signal generator including multiple different pattern signal generators to generate different types of signal patterns; and
   a scheduler of the memory controller to schedule the test data signal pattern in accordance with a memory device I/O protocol, and sending the test data signal pattern to the memory device to cause the memory device to execute an I/O operation to implement a portion of the test transaction.

2. The apparatus of claim 1, wherein the memory controller is to receive the test transaction from a test engine coupled to the memory controller in parallel to a memory access request path used by a host processor.

3. The apparatus of claim 1, wherein the memory controller further comprises a write data buffer, and the write data buffer includes test signal generator logic.

4. The apparatus of claim 3, wherein the write data buffer is used to buffer write data transactions for standard memory access transactions, and is further used to generate the test data signal pattern for the test transaction.

5. The apparatus of claim 1, wherein the test signal generator is to generate the signal pattern by selecting bits of an M×N buffer array of bits.

6. The apparatus of claim 5, wherein the test signal generator is to generate a Boolean combination of bits of the buffer array, where bits are associated with different pattern types.

7. The apparatus of claim 1, wherein the test signal generator is to generate a worst case signal pattern based on victim-aggressor relationships of lanes of the data bus, where the worst case signal pattern is provided on an aggressor lane.

8. The apparatus of claim 7, wherein the test signal generator is to repeat generating the worst case signal pattern multiple times, each repetition switching which lane is the aggressor lane.

9. The apparatus of claim 1, wherein the multiple pattern signal generators are selected from a linear shift feedback register (LSFR), a square wave generator, a frequency generator, or a pattern buffer.

10. The apparatus of claim 1, wherein the multiple pattern signal generators further include associated storage to save and restore pattern signal generation state.

11. The apparatus of claim 1, wherein the test signal generator includes pattern signal generator logic for read operations that is separate from test signal generator logic for write operations.

12. The apparatus of claim 1, wherein the memory controller is to further read back data written to the memory device, compare the read back data to expected data, and generate an error when the read back data and the expected data do not match.

13. A method comprising:
receiving a test transaction at a memory controller, the test transaction indicating one or more memory I/O (input/output) operations to perform a test on a memory device coupled to the memory controller;
in response to receiving the test data transaction, generating with a test signal generator of the memory controller, a test data signal pattern, including selecting from multiple different pattern signal generators of the test signal generator that generate different types of signal patterns;
scheduling the test data signal pattern with a scheduler of the memory controller in accordance with a memory device I/O protocol; and
sending the test data signal pattern to the memory device to cause the memory device to execute an I/O operation to implement a portion of the test transaction.

14. The method of claim 13, wherein the memory controller includes a write data buffer, and generating the test data signal pattern comprises generating the test data signal pattern with logic of the write data buffer.

15. The method of claim 13, wherein generating the test data signal pattern comprises generating a worst case signal pattern based on victim-aggressor relationships of lanes of the data bus, where the worst case signal pattern is provided on an aggressor lane.

16. The method of claim 13, further comprising
reading back data written to the memory device;
comparing the read back data to expected data; and
generating an error when the read back data and the expected data do not match.

17. An electronic device comprising:
a memory subsystem including
a memory device to store data and execute memory device commands to access and manage the data;
a memory controller coupled to the memory device, the memory controller having an input to receive a test transaction, the test transaction indicating one or more memory I/O (input/output) operations to perform a test on a memory device coupled to the memory controller;
a test signal generator of the memory controller to generate a test data signal pattern in response to the memory controller receiving the test data transaction, the test signal generator including multiple different pattern signal generators to generate different types of signal patterns; and
a scheduler of the memory controller to schedule the test data signal pattern in accordance with a memory device I/O protocol, and sending the test data signal pattern to the memory device to cause the memory device to execute an I/O operation to implement a portion of the test transaction; and
a touchscreen display coupled to generate a display based on data stored in the memory subsystem.

18. The electronic device of claim 17, wherein the memory controller further comprises a write data buffer, and the test signal generator comprises logic of the write data buffer.

19. The electronic device of claim 17, wherein the test signal generator generate the signal pattern by selecting bits of an M×N buffer array of bits, wherein N is a number of bits equal to a width of the data bus.

20. A memory subsystem comprising:
a memory device to store data and execute memory device commands to access and manage the data; and
a memory controller coupled to the memory device, the memory controller having an input to receive read back test data written to a specific memory address during a memory test of the memory device, the test data read back via an access command identifying the specific memory address, the memory controller having circuitry to compare the read back data to expected data, and record an error with the specific memory address when the read back data does not match the expected data, the memory controller additionally having storage circuitry to store the actual read back data with the specific memory address when the read back data does not match the expected data.

21. The memory subsystem of claim 20, wherein the memory controller is to store a result of an XOR operation between the read back data and the expected data with the specific memory address.

22. The memory subsystem of claim 20, wherein the memory controller is to store a number of transactions in a test sequence when the read back data does not match the expected data.

23. The memory subsystem of claim 20, wherein the memory controller is to store a number of failures at a region including the specific memory address.

24. The memory subsystem of claim 20, wherein the memory controller is to mask errors by cycle, address, or lane, and record only selected errors.

25. The memory subsystem of claim 20, wherein the memory controller is to stop a test based on a number of errors or a location of an error.

26. The memory subsystem of claim 20, wherein the memory controller includes a write data buffer, and the memory controller is to record the error and the specific address in the write data buffer.

27. The memory subsystem of claim 20, wherein the memory controller is to record the error and the specific address in a cache external to the memory controller.

\* \* \* \* \*